United States Patent
Budde

(10) Patent No.: US 12,270,720 B2
(45) Date of Patent: Apr. 8, 2025

(54) METHOD FOR ISO 26262-COMPLIANT EVALUATION OF A PRESSURE-SENSOR SIGNAL

(71) Applicant: ELMOS Semiconductor SE, Dortmund (DE)

(72) Inventor: Wolfram Budde, Castrop-Rauxel (DE)

(73) Assignee: Elmos Semiconductor SE, Dortmund (DE)

(*) Notice: Subject to any disclaimer, the term of this patent is extended or adjusted under 35 U.S.C. 154(b) by 173 days.

(21) Appl. No.: 18/023,393

(22) PCT Filed: Aug. 10, 2021

(86) PCT No.: PCT/DE2021/100681
§ 371 (c)(1),
(2) Date: Feb. 27, 2023

(87) PCT Pub. No.: WO2022/057970
PCT Pub. Date: Mar. 24, 2022

(65) Prior Publication Data
US 2023/0314256 A1  Oct. 5, 2023

(30) Foreign Application Priority Data
Sep. 15, 2020  (DE) .......................... 102020123930.0

(51) Int. Cl.
*G01L 27/00* (2006.01)
*G01L 9/00* (2006.01)

(52) U.S. Cl.
CPC ............ *G01L 27/00* (2013.01); *G01L 9/0052* (2013.01)

(58) Field of Classification Search
CPC . G01L 19/147; G01L 9/0072; G01L 19/0645; G01L 19/0084; G01L 13/025;
(Continued)

(56) References Cited

U.S. PATENT DOCUMENTS

| 7,714,757 | B2* | 5/2010 | Denison | ............... | A61B 5/7203 |
|---|---|---|---|---|---|
| | | | | | 341/143 |
| 11,728,823 | B2* | 8/2023 | Motz | ....................... | H03M 1/66 |
| | | | | | 341/143 |
| 2005/0038623 | A1 | 2/2005 | Hammerschmidt | | |

FOREIGN PATENT DOCUMENTS

| CA | 2731896 A1 * | 8/2011 | ......... G01L 19/0092 |
|---|---|---|---|
| CN | 109212258 A | 1/2019 | |

(Continued)

OTHER PUBLICATIONS

"The Hilbert space L," retrieved from [2]https://de.wikipedia.org/wiki/Lp-Raum#Der_Hilbertraum_L2.
(Continued)

*Primary Examiner* — Andre J Allen
(74) *Attorney, Agent, or Firm* — Michael J. McCandlish; Mindful IP PLLC

(57) ABSTRACT

A device and a method evaluate signals from one or more Wheatstone bridges. The requirements of ISO 26262 are taken into account by mixing a test signal with the measurement signal before amplification and before analog-to-digital conversion. After amplification and analog-to-digital conversion, the measurement signal and the test signal are unmixed again. If the test signal does not meet the expectation, the amplifier and/or the analog-to-digital converter is determined to be faulty.

14 Claims, 7 Drawing Sheets

(58) Field of Classification Search
CPC .............. G01L 19/0007; G01L 19/0038; G01L 9/0042; G01L 9/0073; G01L 9/0075; G01L 9/0054; G01L 9/0055; G01L 19/04; G01L 7/00; G01L 7/04; G01L 19/148; G01L 19/14; G01L 19/143; G01L 17/00; G01L 7/18; G01L 19/0092; G01L 15/00; G01L 9/0051; G01L 7/041; G01L 9/12; G01L 9/065; G01L 19/0618; G01L 9/0052; G01L 9/125; G01L 7/16; G01L 19/0609; G01L 19/003; G01L 9/007; G01L 19/0627; G01L 19/0046; G01L 9/0022; G01L 9/06; G01L 19/0636; G01L 7/084; G01L 13/02; G01L 19/0023; G01L 19/142; G01L 7/043; G01L 19/08; G01L 9/0002; G01L 19/02; G01L 9/008; G01L 19/141; G01L 9/006; G01L 11/02; G01L 19/0672; G01L 23/10; G01L 23/18; G01L 19/0681; G01L 9/0077; G01L 19/12; G01L 27/005; G01L 7/082; G01L 9/0044; G01L 19/0015; G01L 19/0069; G01L 7/063; G01L 9/0001; G01L 19/146; G01L 21/12; G01L 27/002; G01L 27/007; G01L 9/16; G01L 11/00; G01L 19/00; G01L 9/0026; G01L 9/0089; G01L 9/045; G01L 9/14; G01L 19/0654; G01L 1/2281; G01L 11/025; G01L 13/026; G01L 11/008; G01L 7/22; G01L 13/00; G01L 9/0047; G01L 9/0076; G01L 7/08; G01L 9/0025; G01L 9/0035; G01L 9/0005; G01L 9/0041; G01L 19/0061; G01L 21/00; G01L 9/0019; G01L 9/10; G01L 9/08; G01L 11/006; G01L 9/04; G01L 19/086; G01L 9/0008; G01L 1/18; G01L 11/004; G01L 19/069; G01L 9/00; G01L 9/0057; G01L 19/083; G01L 19/10; G01L 19/16; G01L 19/06; G01L 9/0016; G01L 13/023; G01L 7/048; G01L 9/0048; G01L 9/0027; G01L 9/0086; G01L 9/0079; G01L 11/04; G01L 1/20; G01L 9/0091; G01L 27/00; G01L 11/002; G01L 23/24; G01L 7/182; G01L 1/02; G01L 19/0663; G01L 7/166; G01L 23/22; G01L 9/0036; G01L 9/0061; G01L 9/0039; G01L 23/125; G01L 19/145; G01L 9/0013; G01L 21/04; G01L 9/0045; G01L 9/0092; G01L 1/142; G01L 7/104; G01L 9/0033; G01L 9/0083; G01L 9/0098; G01L 1/2293; G01L 7/24; G01L 9/02; G01L 21/22; G01L 9/0029; G01L 7/022; G01L 1/205; G01L 9/0064; G01L 23/08; G01L 5/14; G01L 23/16; G01L 7/088; G01L 7/163; G01L 9/0007; G01L 13/06; G01L 23/222; G01L 1/16; G01L 1/2287; G01L 9/0085; G01L 9/025; G01L 1/2212; G01L 21/14; G01L 9/0004; G01L 23/02; G01L 9/003; G01L 9/085; G01L 1/14; G01L 1/148; G01L 9/0058; G01L 9/105; G01L 7/02; G01L 7/061; G01L 9/002; G01L 1/2231; G01L 13/028; G01L 9/0095; G01L 23/28; G01L 1/162; G01L 19/0076; G01L 7/12; G01L 9/0038; G01L 9/0032; G01L 21/10; G01L 7/024; G01L 19/149; G01L 1/246; G01L 7/086; G01L 1/005; G01L 7/06; G01L 1/2206; G01L 5/228; G01L 7/102; G01L 13/021; G01L 27/02; G01L 1/2262; G01L 1/24; G01L 1/26; G01L 19/144; G01L 23/00; G01L 9/0094; G01L 9/0082; G01L 1/125; G01L 9/0097; G01L 1/146; G01L 1/2268; G01L 11/06; G01L 21/30; G01L 21/34; G01L 23/221; G01L 7/187; G01L 7/20; G01L 23/26; G01L 7/068; G01L 1/144; G01L 1/225; G01L 23/32; G01L 7/14; G01L 1/165; G01L 23/12; G01L 1/241; G01L 13/04; G01L 7/045; G01L 1/086; G01L 1/22; G01L 7/108; G01L 9/18; G01L 1/127; G01L 17/005; G01L 5/18; G01L 1/245; G01L 21/32; G01L 1/183; G01L 1/2218; G01L 9/0023; G01L 1/243; G01L 23/145; G01L 5/0047; G01L 5/0076; G01L 9/0088; G01L 1/106; G01L 1/10; G01L 9/001; G01L 1/186; G01L 23/223; G01L 25/00; G01L 5/165; G01L 5/226; G01L 9/0017; G01L 1/044; G01L 3/245; G01L 9/005; G01L 1/08; G01L 21/16; G01L 3/1485; G01L 5/0038; G01L 5/162; G01L 5/225; G01L 7/026; G01L 7/065; G01L 9/0014; G01L 1/04; G01L 1/242; G01L 21/24; G01L 3/10; G01L 5/0004; G01L 5/0052; G01L 7/10; G01L 1/00; G01L 1/103; G01L 1/2275; G01L 1/247; G01L 21/02; G01L 21/26; G01L 23/225; G01L 3/102; G01L 3/105; G01L 5/223; G01L 5/24; G01L 7/028; G01L 9/0011; G01L 5/00; G01L 5/0028; G01L 5/243; G01L 1/083; G01L 1/12; G01L 21/36; G01L 23/04; G01L 23/14; G01L 23/30; G01L 3/103; G01L 5/0033; G01L 5/102; G01L 5/133; G01L 5/1627; G01L 5/166; G01L 7/185; G01L 1/255; G01L 21/08; G01L 5/0057; G01L 5/22; G01L 1/042; G01L 1/122; G01L 1/2225; G01L 1/2243; G01L 1/2256; G01L 1/248; G01L 2009/0067; G01L 2009/0069; G01L 21/06; G01L 23/06; G01L 3/00; G01L 3/06; G01L 3/1478; G01L 3/1492; G01L 3/18; G01L 3/24; G01L 3/242; G01L 5/0061; G01L 5/08; G01L 5/10; G01L 5/101; G01L 5/108; G01L 5/16; G01L 5/161; G01L 5/167; G01L 5/28; G01L 1/046; G01L 2009/0066; G01L 2019/0053; G01L 23/085; G01L 23/20; G01L 5/0071; G01L 5/008; G01L 5/06; G01L 5/171; G01L 7/106
USPC ................................................... 73/700–756
See application file for complete search history.

(56) References Cited

FOREIGN PATENT DOCUMENTS

| | | | | |
|---|---|---|---|---|
| DE | 3207833 | A1 | 9/1983 | |
| EP | 1087219 | A2 | 3/2001 | |
| EP | 1801964 | A1 * | 6/2007 | ............ G01G 3/147 |
| EP | 2362203 | A2 | 8/2011 | |
| EP | 2523895 | B1 | 6/2014 | |
| EP | 2523896 | B1 | 6/2014 | |
| EP | 2524198 | B1 | 7/2014 | |
| EP | 2524390 | B1 | 8/2014 | |

(56) References Cited

FOREIGN PATENT DOCUMENTS

EP          2524389 B1    6/2016
JP          2001183254 A  7/2001

OTHER PUBLICATIONS

Christopher R. Nerz, "Introduction to Differential Geometry" S198, definition X.1.5, retrievable from https://www.math.uni-tuebingen.de/de/forschung/gadr/lehre/sose2015/diffgeo.pdf.
Godoy Pet al. "Chopper Stabilization of Analog Multipliers. Variable Gain Amplifiers. and Mixers," IEEE Journal of Solid-State Circuits, IEEE, USA, vol. 43, No. 10, Oct. 1, 2008 (Oct. 1, 2008), pp. 2311-2321.
Translated International Search Report and Written Opinion, issued Mar. 10, 2022, in correlated international application PCT/DE2021/100681.
Wei Chia-Ling et al. "Respiration Detection Chip With Integrated Temperature-Insensitive MEMS Sensors and CMOS Signal Processing Circuits," IEEE Transactions on Biomedical Circuits and Systems, IEEE, US, vol. 9, No. 1, Feb. 1, 2015 (Feb. 1, 2015), pp. 105-112.

\* cited by examiner

METHOD FOR ISO 26262-COMPLIANT EVALUATION OF A PRESSURE-SENSOR SIGNAL

CROSS REFERENCE TO RELATED APPLICATIONS

The present patent application is a national stage of, and claims priority to, PCT Application No. PCT/DE2021/100681, filed on Aug. 10, 2021, which application claims the priority of the German patent application 10 2020 123 930.0 filed Sep. 15, 2020, the disclosures of which are incorporated by reference in the present patent application in their entireties.

TECHNICAL FIELD

The disclosure discloses a method for monitoring a sensor system in operation with a sensor element (WE), in particular a piezoresistive Wheatstone bridge (WB) of a pressure sensor, and the associated devices and method modifications.

INTRODUCTION

Automotive applications typically employ numerous safety-relevant sensors, which the vehicle's control system must typically monitor for correct function during their operation. These include, for example, pressure-measuring devices in brake systems.

BACKGROUND

Various chopper methods for improving the signal-to-noise ratio in amplifiers are known from the prior art. Here, a multiplier upstream of the amplifier multiplies the signal by a chopper signal with a chopper frequency, then amplifies it and then multiplies it again by the chopper signal. In the process, this multiplication mixes the amplified signal up on the one hand and also down on the other hand. Since only the down-mixed portion is of interest, a low-pass filter suppresses the signal components with the chopper frequency and all higher frequencies. This typically suppresses the 1/f noise of the amplifier stage. Combining such a process with a sensor element results in a low-noise sensor system.

Such a sensor system thus then implements a method for operating a sensor system, in which the sensor system has a sensor element that provides an input signal with a time course of its input signal value. Such a sensor system comprises a signal path. The signal path includes, at a first location on the signal path, an amplifier having an input and an output. The signal path begins with the input signal. from the sensor element and ends with a first output signal from the sensor system. The value of the first output signal or the value of a signal derived therefrom represents the measured value. A first step of the prior an method is a first mixing of the signal in the signal path with the chopper signal at a second location in the signal path. Here, this second location in the signal path is between the input signal of the sensor element at the beginning of the signal path and the input of the amplifier located at the first location in the signal path. The chopper signal is typically mono-frequency. As a further step, the second mixing of the signal occurs at a third location in the signal path. The second mixing of the signal is typically a mixing down of the signal with the chopper signal to a first demodulated signal. This third location is in the signal path between the output of the amplifier, which is at the first location in the signal path, and the first output signal of the sensor system, which is at the end of the signal path. A first filtering of the first demodulated signal or a signal derived therefrom occurs at a fourth location in the signal path. The fourth location in the signal path is between the third location in the signal path on the one hand and the output signal of the sensor system at the end of the signal path on the other hand. This first filtering is performed by applying a first filter function to the first demodulated signal or to a signal derived therefrom. The first filter function describes the relationship between the time course of the first demodulated signal or the signal derived therefrom on the one hand and the time course of the signal immediately after the first filtering on the other. The first output signal is dependent on this signal, which is the result of the first filtering, or is the result of this first filtering.

The first filter function F1[ ] is chosen so that essentially filtering the chopper signal Cs with the first filter function F[ ] vanishes, F1[Cs]=0, and filtering a constant F1[1]=$\beta_1$ with $\beta_1$ as a real or complex value results in the form of a constant.

The disadvantage is that the control system typically must shut down such sensor systems for a functional check during operation.

SUMMARY

The task of the proposal is therefore to create a solution that does not have this disadvantage of the prior art and has timber advantages.

To solve the problem, the paper presented herein proposes a method for monitoring a sensor system in operation, in which the sensor system has a sensor element WB that provides an input signal Si with a time course Si(t) of its input signal value. The sensor system has a signal path in which various device elements modify and evaluate the signal in the signal path. At a first location in the signal path, the signal path comprises an amplifier DV having an input and an output. The signal path begins at the input signal Si, which is the output signal of the sensor element WB. The signal path ends at the first output signal out1 of the sensor system. The value of the first output signal out1 of the sensor system or the value of a signal derived therefrom, if necessary, for example by amplification, filtering or other further processing, then typically represents the measured value. As an exemplary first step, the proposed method comprises a first mixing of the signal in the signal path by means of a first mixer, for example a first multiplier M1, with a chopper signal Cs at a second location in the signal path, which typically differs from the first location at which the amplifier DV is located. Preferably, therefore, the mixer or first multiplier M1 is located at this second position in the signal path. Of course, it is also conceivable to perform this mixing by an appropriate design of the amplifier DV in the amplifier DV, in which case, for example, the gain of the amplifier DV would depend on the chopper signal Cs. For example, for this purpose the amplifier DV may comprise a Gilbert multiplier as an amplifier stage. Instead, however, it has generally proved useful to implement the signal path differentially and to realize the first multiplier Ml as a changeover switch which interchanges the two signals of the differential signal in the signal path in dependence on the chopper signal Cs. This is particularly useful when a Wheatstone bridge is used as sensor element WB, since this already provides a differential signal. This second location for performing this first mixing, for example the position of the first multiplier, is typically located in the signal path between the input signal Si, which is the output signal of the sensor element, at the beginning of the signal path and the input of the amplifier DV at the first location in the signal path. For the suppression of the 1/f noise to work reliably, the chopper signal Cs is preferably band-limited or mono-frequency. This measure raises the sensor output signal, i.e., the time course Si(t) of the typically very low frequency input signal Si, by the frequency of the chopper signal Cs in the frequency spectrum. The subsequent amplifier stages, analog-to-digital converter stages and filter stages thus contaminate the frequency range of the thus frequency-boosted input signal Si only with white noise and the signal-to-noise ratio improves. In order to be able to use the amplified and digitized sensor signal again, the sensor system must reverse this process. To do this, a second mixer, which is typically a second multiplier M2, typically performs a second mixing of the signal at a third location in the signal path with the chopper signal Cs to form a first demodulated signal DM1, Preferably, this third location in the signal path is between the output of the amplifier DV, which is indeed located at the first location in the signal path, and the first output signal out1 of the sensor system at the end of the signal path. A first filtering of the first demodulated signal DM1 or a signal derived therefrom takes place at a fourth position in the signal path between the third position in the signal path on the one hand and the output signal out1 of the sensor system at the end of the signal path on the other hand. Typically, a first low-pass filter LP1 performs this first filtering with a first filter function F1[ ]. Thus, this first filtering is performed by means of the application of said first filter function F1[ ] to the first demodulated signal DM1 or the signal derived therefrom by the first low-pass filter LP1. Instead of a low-pass filter, other filters are also conceivable depending on the application. However, the paper presented here assumes that the measured value to be determined changes cyclically only slowly and not predictably, and that therefore the DC component of the measured value represents the essential information. The first filter function F1[ ] describes the relationship between the time course DM1(t) of the first demodulated signal DM1 or the signal derived from it on the one hand and the time course of the signal immediately after the first filtering on the other hand. The first output signal out1 depends on this signal immediately after the first filtering using the first filter function F1[ ]. However, the first output signal out1 can also be directly the result of this first filtering using the first filter function F1[ ]. Now, in order to be able to monitor the signal processing devices in the signal path to at least a large extent, in contrast to the prior art, the sensor system feeds a test signal TSS into the signal path. The sensor system takes the modified test signal TSS from the signal path again after it has passed through the signal path. The sensor system then evaluates this test signal that has been taken out again. The design of the first filter function F1[ ] and the test signal TSS is preferably such that the first output signal out1 no longer contains any significant components of the test signal TSS A first low-pass filter LP1 implementing the first filter function F1[ ] in the sensor system thus blocks the transmission of signal components corresponding to the test signal TSS from its input to its output. In order to perform this test signal injection and extraction in the signal path, the proposed method comprises additional steps. In particular, this includes adding an orthogonal chopper signal Cs90 or a test signal TSS derived therefrom to the signal in the signal path. This addition takes place at a fifth position in the signal path. This fifth location is preferably between the input signal Si, which is the output signal of the sensor element WB, at the beginning of the signal path and the input of the amplifier DV at the first location in the signal path. The chopper signal Cs has a time course Cs(t) of the chopper signal Cs and the orthogonal chopper signal Cs90 has analogously a time course Cs90(t) of the orthogonal chopper signal Cs90. The time course Cs(t) of the chopper signal Cs must satisfy some conditions that this paper will state later. As long as these conditions are satisfied, the choice of the time course of the chopper signal Cs is relatively free. However, the writing presented here recommends that the frequency bandwidth of the chopper signal not be too wide, otherwise the response time of the sensor system may suffer. The time course Cs90(t) of the orthogonal chopper signal Cs90 must also satisfy some, albeit narrower, conditions, which this paper also specifies later. As long as these conditions are satisfied, the choice of the time course of the orthogonal chopper signal Cs90 is relatively free. However, this paper recommends that the frequency bandwidth of the orthogonal chopper signal Cs90 should also not be too wide, otherwise the response time of the sensor system may also suffer under certain circumstances. With respect to the said first filter function F1[ ], the time course Cs90(t) of the orthogonal chopper signal Cs90 essentially has, except for noise and similar signal errors, the property F1[Cs90(t)×Cs(t)]=0 at least at times. This means that the orthogonal chopper signal Cs90 is orthogonal to the chopper signal Cs at typically predeterminable times.

For explanation we assume that X(t) is the time course of an arbitrary, not further defined signal. As an example, we assume that the first filter function F1[X] is the time indefinite integral of the time course of the exemplary signal X(t). We thus assume that the following holds:

$$F1[X]=\int X\,dt$$

Under this condition, the following would then hold:

$$F1[Cs90(t)\times Cs(t)]=\int Cs90(t)\times Cs(t)\,dt$$

The first filter function F1[ ] in this example would then be nothing else than the L2 product of the chopper signal Cs and the orthogonal chopper signal Cs90. For the L2 product, we refer for example to https://de.wikipedia.org/wiki/Lp-Raum #Der_Hilbertraum_L2 and there to the section "The Hilbert space $L^2$". The L2 product is a scalar product on $L^2$. Another writing is for example the script "Introduction to Differential Geometry" by Christopher R. Nerz, S198, definition X.1.5, which the reader can find at the time of this writing at https://www.math.uni-tuebingen.de/de/forschung/gadr/lehre/sose2015/diffgeo.pdf. For example, it is conceivable that the chopper signal Cs follows a time sine function and the orthogonal chopper signal Cs90 follows a time cosine function. In such a case it is obvious that then the condition F1[Cs90(t)×Cs(t)]=0 is not always satisfied, but only at certain times. If the said first low-pass filter LP1 executes the first filter function, it is thus useful if the design of the sensor system provides a holding circuit at the output of this first low-pass filter LP1. The holding circuit samples the current value of the first filter function F1[ ] of the first low-pass filter LP1 whenever the condition F1[Cs90(t)×Cs(t)]=0 is satisfied. The holding circuit then freezes this current value at its output until the next time condition F1[Cs90(t)×Cs(t)]=0 is satisfied. This sampling by the holding circuit transforms the indefinite integral of the example into a definite integral.

$$F1[Cs90(t)\times Cs(t)]=\int_0^{Tp} Cs90(t)\times Cs(t)\,dt$$

Here it is assumed that the chopper signal Cs and the orthogonal chopper signal are periodic with respect to a common signal period $T_p$. This sampling of the filter output signal of a filter at times of the actually present orthogonality, i.e. the satisfaction of the boundary conditions, shall also apply to the filters and their filtering mentioned in the following.

As a further step, a third mixing is performed The third mixing is a mixing of the first demodulated signal DM1 or a signal derived therefrom on the one hand with the orthogonal chopper signal Cs90 or with a signal derived from the orthogonal chopper signal Cs90 on the other hand. The third mixing generates a second demodulated signal DM2. In this third step, a second filter function F2[ ] typically also filters the second demodulated signal DM2 or a signal derived therefrom to a second output signal out2 as a second filtering.

The second filter F2[ ] is typically chosen such that essentially the conditions $F2[Cs(t)]=0$ and $F2[Cs90(t)]=0$ and $F2[Cs(t) \times Cs90(t)]=0$ and $F2[1]=\beta_2$ with $\beta_2$ as real or complex values hold. Furthermore, the first filter function F1[ ] is typically selected such that essentially the conditions $F1[Cs(t)]=0$ and $F1[Cs90(t)]=0$ and $F1[Cs(t) \times Cs90(t)]=0$ and $F1[1]=\beta_1$ with $\beta_1$ as real or complex value hold. Here, preferably, a sampling of the filter output signal of the second low-pass filter LP2 with the second filter function F2[ ] always takes place at the times at which these conditions for the second filter function F2[ ] are satisfied. Here, a sampling of the filter output signal of the first low-pass filter LP1 with the first filter function F1[ ] always takes place analogously at the times at which these conditions for the first filter function F1[ ] are satisfied. The second output signal out2 therefore preferably consists of the samples of the output value of the second filter function F2[DM2] of the second low-pass filter LP2, which the sensor system samples at times when the conditions for the second filter function F2[ ] are satisfied. The first output signal out1 therefore preferably consists of the samples of the output value of the first filter function F1[DM1] of the first low-pass filter LP1, which the sensor system samples at times when the conditions for the first filter function F1[ ] are satisfied.

In order to conclude the correct function of the device parts in the signal path, a first comparison of the value of the second output signal out2 or the value of a signal derived therefrom on the one hand with an expected value interval on the other hand takes place. Furthermore, the conclusion on an error of a device part in the signal path is reached if the value of the second output signal out2 or the signal derived therefrom lies outside the expected value interval.

It is obvious to the person skilled in the art that, if necessary, he can implement parts of the signal path in a signal processor and an associated signal processor program. When talking, about a signal path here, the spatial positioning becomes a temporal positioning in case of an implementation as a program in a signal processor. Thus, the positions in the signal path then convert to processing times in the sequence of signal processing steps. Therefore, even if the subject matters to be protected here suggest a spatial positioning and arrangement from the wording, they also comprise a temporal positioning and sequence.

A Dicke method for white noise reduction can complement the proposed method, if necessary. The basic idea of a Dicke receiver is to compare the DUT placed in a noisy environment with an equivalent noise source.

As a reference noise source, our example of a Wheatstone bridge WB therefore uses a second Wheatstone bridge, the reference Wheatstone bridge RW, which the design of the sensor system preferably makes completely the same and which the manufacturing process therefore typically makes the same. The reference Wheatstone bridge RW can typically but preferably does not show a measurement signal. For example, if the sensor element is a piezoresistive micromechanical pressure sensor in which a Wheatstone bridge with piezoresistive resistors is arranged on a diaphragm above a cavity, the reference element RW may be a second pressure sensor with a second Wheatstone bridge of exactly the same construction and preferably realized on the same silicon crystal. In the now following proposal, the sensor system will generate a second output signal out2 indicating the difference between the output signal of the reference element, hereinafter referred to as reference signal Rs, and the output signal of the sensor element, herein the input signal Si. In case of equality of sensor element WB and reference element RW, this second output signal out2 should be zero. However, due to manufacturing tolerances and despite all closeness still slightly different operating parameters like temperature and the unavoidable system noise, this second output signal out2 will never be completely zero in reality. Rather, it will have to be within an expected value interval in terms of value, which the sensor system can check. This is also true in the case where the reference element cannot provide a measured value. In the case of the exemplary micromechanical pressure sensor as sensor element, the reference element RW can also comprise, for example, only the reference Wheatstone bridge without a diaphragm and without a cavity, so that the influence of the pressure is massively smaller. In this example, the reference Wheatstone bridge is made equal (English "matching") to the Wheatstone bridge. In this example of a piezoresistive pressure sensor, the Wheatstone bridge of the pressure sensor together with its diaphragm and its cavity, and together with the reference Wheatstone bridge, are accommodated on a common silicon crystal. In this exemplary case, the reference Wheatstone bridge and the Wheatstone bridge then generate noise in the same way, which enables the elimination of noise.

The proposed noise reduction method therefore comprises, as a first step, providing a reference element RW that provides a reference signal Rs. This reference element RW may be, for example, the reference Wheatstone bridge mentioned by way of example. Analogous to the processing of the input signal Si in the signal path, a corresponding processing of the reference signal Rs takes place in a reference signal path. It is of particular importance that the reference signal path is designed to be the same as the signal path for processing the input signal Si. This means that the reference signal path has positions of processing of the reference signal in the reference signal path that directly correspond to corresponding positions of processing of the signal in the signal path. If a device in the reference signal path performs processing at a position in the reference signal path, a corresponding device in the signal path of the same design performs the same processing of the signal in the signal path in the same manner. Thus, the signal processing of the reference signal Rs in the reference signal path is initially a spatially parallel processing to the signal processing of the input signal Si in the signal path, which is performed in as much as possible the same way as the signal processing of the input signal Si in the signal path.

An alternative design can now replace this space multiplex with a time multiplex in certain parts of the signal path, if necessary, which has the advantage that the sensor system then uses not only identical device parts and process steps, but identical ones. Compared to the space multiplex, this increases the equality of the noise in the reference signal path and in the signal path.

By space multiplex we understand here the temporally PARALLEL processing of signals in several identical or similar devices. In contrast, here we understand time-division multiplexing as the SERIAL processing of signals in one device. In the case of time-division multiplexing, the processing takes place in signal packets which are processed by the said device one after the other in time.

The reference signal path starts at the reference element RW with the reference signal Rs. The reference signal path ends at the second output signal out2.

However, in order to use the reference element RW, the reference signal path at the beginning of the reference signal path at the reference signal Rs must be different from the signal path at the beginning of the signal path at the input signal Si. In the proposal presented here, at least the amplifier DV shall be common to the reference signal path and the signal path. Thus, at a first location of the reference signal path, the reference signal path comprises the amplifier DV with the input and the output. This first location of the reference signal path with the amplifier DV with its input and output is thus also the first location of the signal path with the amplifier DV with its input and output. Thus, the amplifier DV is part of the reference signal path at a first location in the reference signal path and at the same time also part of the signal path at the first location of the signal path. The reference signal Rs is located at the beginning of the reference path. The reference signal path has a sixth location in the reference signal path between the reference signal Rs and the input of the amplifier DV at the first location in the reference path. The signal path has at a corresponding sixth location in the signal path between the input signal Si located at the beginning of the signal path and the input of the amplifier DV at the first location in the signal path, which is common to the signal path and the reference signal path. In the reference signal path, and in the signal path, at a common sixth location in the reference signal path and signal path, there is a switch DS common to the signal path and the reference signal path and having a first input and a second input. In the reference signal path, the common changeover switch DS is thus located at the sixth position in the reference signal path. In the signal path, the common changeover switch DS is thus located at a corresponding sixth position in the signal path, which is a common sixth position in the reference signal path and signal path.

The common changeover switch DS selects its active input depending on a second chopper signal Cs2 between its first input and its second input.

The signal path comprises the first input of the changeover switch DS, while the reference signal path comprises the second input of the changeover switch DS. Accordingly, the signal path does not include the second input of the changeover switch DS and the reference path does not include the first input of the changeover switch DS.

The common changeover switch DS selects its active input chosen in dependence on a second chopper signal Cs2 and accordingly switches through the current value at this active input of the common changeover switch DS to its output of the common changeover switch DS.

The reference signal path and the signal path are thus identical in the section from the output of the common changeover switch DS at the sixth position in the reference signal path and signal path and the input of the amplifier DV at the first position in the reference signal path and signal path.

However, the first filtering with the first filter function F1[ ] is excluded and explicitly not part of the reference signal path. Typically, the exemplary first low-pass filter TP1 is not part of the reference signal path.

A fourth mixing of the first demodulated signal DM1 or a signal derived therefrom with the second chopper signal Cs2 generates a third demodulated signal DM3. This third mixing may take place in a third mixer, for example a third multiplier M3.

A third filtering of the third demodulated signal DM3 or of a signal derived therefrom by means of a third filter function F3[ ] to a third output signal out3 initially completes the signal processing here. This third filtering can, for example, take place in a third low-pass filter LP3, which then implements the third filter function F3[ ].

The sensor system must ensure clean separation of i) the measured signal component of the sensor element and ii) the differential signal component from the difference between the measured signal component of the sensor element WB and the reference signal component of the reference element RW and iii) the test signal component. For this purpose, a) the first filter function F1[ ] of the exemplary first low-pass filter LP1 and b) the second filter function F2[ ] of the exemplary second low-pass filter LP2 and c) the third filter function F3[ ] of the exemplary third low-pass filter LP3 must satisfy certain, conditions.

Therefore, the design of the sensor system selects the first filter function F1[ ] such that essentially the following conditions are satisfied:

$$F1[Cs(t)]=0 \text{ and } F1[Cs2(t)]=0$$

$$F1[Cs90(t)]=0$$

$$F1[Cs(t) \times Cs2(t)]=0$$

$$F1[Cs(t) \times Cs90(t)]=0$$

$$F1[Cs2(t) \times Cs90(t)]=0$$

$$F1[Cs(t) \times Cs2(t) \times Cs90(t)]=0$$

$$F1[1]=\beta_1$$

Here, $\beta_1$ is a real or complex value. As mentioned before, a device of the sensor system preferably samples the output of the exemplary first low-pass filter LP1 at exactly such times at which these conditions are satisfied, if one disregards the unavoidable slight deviations due to noise and manufacturing errors etc.

The design of the sensor System also selects the second filter function F2[ ] such that essentially the following conditions are satisfied:

$$F2[Cs(t)]=0$$

$$F2[Cs2(t)]=0$$

$$F2[Cs90(t)]=0$$

$$F2[Cs(t) \times Cs2(t)]=0$$

$$F2[Cs(t) \times Cs90(t)]=0$$

$$F2[Cs2(t) \times Cs90(t)]=0$$

$$F2[Cs(t) \times Cs2(t) \times Cs90(t)]=0$$

$$F2[1]=\beta_2.$$

Here, $\beta_2$ is a real or complex value, As mentioned before, a device of the sensor system preferably samples the output of the exemplary second low-pass filter LP2 at exactly those times when these conditions are satisfied, in this regard, the technical teachings of this paper disregard the unavoidable slight deviations due to noise and manufacturing errors, etc. Similarly, the design of the sensor system selects the third filter function F3[ ] such that substantially the following conditions are satisfied:

$$F3[Cs(t)]=0$$

$$F3[Cs2(t)]=0$$

$$F3[Cs90(t)]=0$$

$$F3[Cs(t) \times Cs2(t)]=0$$

$$F3[Cs(t) \times Cs90(t)]=0$$

$$F3[Cs2(t) \times Cs90(t)]=0$$

$$F3[Cs(t) \times Cs2(t) \times Cs90(t)]=0$$

$$F3[1]=\beta_3$$

Here, is a real or complex value. Preferably, a holding circuit of the sensor system samples the output of the exemplary third low-pass filter LP3 at sampling times. These sampling instants are thereby exactly such instants at which the above conditions are satisfied. In this context, the technical teachings of this document disregard the unavoidable slight deviations due to noise and manufacturing errors, etc. In order to detect a defect of the reference element or the sensor element, a second comparison of the value of the third output signal out3 or the value of a signal derived therefrom with a third expected value interval is preferably performed. Furthermore, inference of an error occurs if the value of the third output signal out3 or the value of the signal derived therefrom is outside the third expected value interval. For example, a third comparator and a fourth comparator or a signal processor or the like may perform this comparison. The third comparator thereby compares, if necessary, the value of the third output signal out3 with a third threshold value. If necessary, the fourth comparator compares the value of the third output signal out3 with a fourth threshold value.

The disadvantage of the above procedures is that the sensor element, here the exemplary Wheatstone bridge WB, is not part of the signal path section tested with the test signal TSS. The proposed procedure modification now remedies this.

Thus, this paper now proposes a modified method for monitoring a sensor system in operation in which, as before, the sensor system comprises a sensor element WB that provides an input signal Si having an input signal value in dependence on a test signal TSS.

As before, the sensor system has a signal path that again includes an amplifier DV having an input and an output at a first location in the signal path.

As before, the signal path starts with the input signal Si from the sensor element WB and ends with a first output signal out1.

Here, too, the value of the output signal out1 represents the measured value.

Again, a first mixing of the signal in the signal path with a chopper signal Cs takes place at a second position in the signal path. This second position in the signal path is located between the input signal Si from the sensor element at the beginning of the signal path and the input of the amplifier DV at the first position in the signal path.

The chopper signal Cs is again band-limited or mono-frequency. Again, the signal is mixed at a third position in the signal path with the chopper signal Cs to form a first demodulated signal DM1. The third position in the signal path is located between the output of the amplifier DV at the first position in the signal path and the first output signal out1 of the sensor system at the end of the signal path.

As before, a first filtering of the first demodulated signal DM1 or a signal derived therefrom is performed at a fourth position in the signal path between the third position in the signal path on the one band and the first output signal out1 at the end of the signal path on the other hand. This first filtering is performed by applying a first filter function F1[ ] to the first demodulated signal DM1 or to a signal derived therefrom. The first filter function F1[ ] describes the relationship between the time course DM1($t$) of the first demodulated signal DM1 or the signal derived therefrom on the one hand and the time course of the signal on the other. This course of the signal is the one immediately after the first filtering, i.e., typically the course of the filter output signal. The first output signal owl depends again on this signal immediately after the first filtering or is itself the result of this first filtering.

In contrast to the prior art, however, the test signal TSS is now also generated in dependence on an orthogonal chopper signal Cs90. The chopper signal Cs has a time course Cs(t) of the chopper signal Cs. The orthogonal chopper signal Cs90 thereby has a time course Cs90($t$) of the orthogonal chopper signal Cs90. The time course Cs90($t$) of the orthogonal chopper signal Cs90 thereby has with respect to the said first filter function F1[ ] essentially except for noise and similar signal errors the property F1[Cs90($t$)×Cs(t)]=0 at least at times. At least the time course Cs90($t$) of the orthogonal chopper signal Cs90 has these properties at the times already discussed.

In contrast to the prior art, a third mixing of the first demodulated signal DM1 or a signal derived therefrom with the orthogonal chopper signal Cs90 or a signal derived therefrom and the generation of a second demodulated signal DM2 are further performed.

A second filtering of the second demodulated signal DM2 or a signal derived therefrom by means of a second. filter function F2[ ] results in a second output signal out2.

The second filter function F2[ ] is selected such that essentially F2[Cs(t)]=0 and F2[Cs90($t$)]=0 and F2[Cs(t)×Cs90($t$)]=0 and F2[1]=$\beta_2$ hold, with $\beta_2$ as real or complex value. As before, a second holding circuit (English: Sample & Hold) samples the output value of the exemplary second low-pass filter LP2, which preferably implements the second filter function F2[DM2], at times when these conditions are satisfied.

The first filter function F1[ ] is selected such that essentially F1[Cs(t)]=0 and F1[Cs90($t$)]=0 and F1[Cs(t)×Cs90($t$)]=0 F1[1]=$\beta_1$ hold, with $\beta_1$ as real or complex value. As before, a first holding circuit samples the output value of the exemplary first low-pass filter LP1, which preferably implements the first filter function F1[DM1], at times when these conditions are satisfied.

If necessary, a sensor device may include a first trigger circuit. The first trigger circuit signals a sampling of the result of the first filter function F1[ ] to the first holding circuit at times when the conditions F1[Cs(t)]=0 and F1[Cs90($t$)]=0 and F1[Cs(t)×Cs90($t$)]=0 F1[1]=$\beta_1$ are satisfied. Here, $\beta_1$ is a real or complex value, The first holding circuit applies the sampling to the first demodulated signal DM1. The first holding circuit forms the first output signal out1 by this sampling.

If necessary, a sensor device may comprise a second trigger circuit. The second trigger circuit signals a sampling of the result of the second filter function F2[ ] to the second holding circuit at times when the conditions F2[Cs(t)]=0 and F2[Cs90($t$)]=0 and F2[Cs(t)×Cs90($t$)]=0 and F2[1]=$\beta_2$ are satisfied. Here, $\beta_2$ is a real or complex value. The second holding circuit applies the sampling to the second demodulated signal DM2. The second holding circuit forms the second output signal out2 by this sampling.

Finally, a first comparison of the value of the second output signal out2 or the value of a signal derived therefrom with an expected value interval is performed again and conclude an error if the value of the second output signal out2 or the signal derived therefrom is outside the expected value interval. Here we refer to the explanations in the preceding sections.

Again, it makes sense to include the sensor element and the reference element in the tested signal path. In this case, a reference element RW is also provided here, which supplies a reference signal Rs. The sensor system processes the reference signal Rs in the reference signal path. The reference signal path is again designed to be the same as the signal path for processing the input signal Si. At this point, the writing presented here refers to the method already described. Again the reference signal path starts with the reference signal Rs and ends again with the second output signal out2.

As before, the reference signal path at the beginning of the reference signal path at reference signal Rs and the signal path at the beginning of the signal path at input signal Si are different.

As before, the reference signal path at the first position in the reference signal path includes the amplifier DV with the input and the output. Thus, as above, the amplifier DV is also part of the reference signal path at the first position in the reference signal path and at the same time part of the signal path at the first position of the signal path.

As before, the reference signal path has a sixth location in the reference signal path between reference signal Rs at the beginning of the reference signal path and input of amplifier DV at the first location in the reference signal path, Again, the signal path has a sixth location in the signal path between input signal Si at the beginning of the signal path and input of the amplifier DV at the first location in the signal path, which is common to the signal path and the reference signal path. Again, the reference signal path and the signal path at this common sixth location in the reference signal path and signal path comprise a changeover switch DS having a first input and a second input, which is common to the signal path and the reference signal path.

The changeover switch DS common to the signal path and the reference signal path selects its active input among these two inputs, as described above, depending on a second chopper signal Cs2 between its first input and its second input.

The signal path again includes the first input of the changeover switch DS and does not include the second input of the changeover switch DS. The reference signal path accordingly includes the second input of the changeover switch DS and does not include the first input of the changeover switch DS.

The common changeover switch DS selects its active input chosen in dependence on a second chopper signal Cs2 and switches the value at this active input of the common changeover switch DS through to the output of the common changeover switch DS.

The reference signal path and the signal path are identical in the section from the output of the common changeover switch DS at the sixth position in the reference signal path and signal path and the input of the amplifier DV at the first position in the reference signal path and signal path.

The first filtering with the first filter function F1[ ], for example the first low-pass filter LP1 is not part of the reference signal path.

A third filtering of the third demodulated signal DM3 or a signal derived therefrom by means of a third filter function F3[ ], for example in a third low-pass filter LP3, generates a third output signal out3.

The sensor system must ensure clean separation of i) the measured signal component of the sensor element and ii) the differential signal component from the difference between the measured signal component of the sensor element WB and the reference signal component of the reference element RW and iii) the test signal component. For this purpose, the first filter function F1[ ] of the exemplary first low-pass filter LP1 and the second filter function F2[ ] of the exemplary second low-pass filter LP2 and the third filter function of the exemplary third low-pass filter LP3 must again satisfy certain conditions.

Therefore, the design of the sensor system selects the first filter function F1[ ] such that essentially the following conditions are satisfied:

$F1[Cs(t)]=0$ $F1[Cs2(t)]=0$ $F1[Cs90(t)]=0$ $F1[Cs(t)\times Cs2(t)]=0$ $F1[Cs(t)\times Cs90(t)]=0$ $F1[Cs2(t)\times Cs90(t)]=0$ $F1[Cs(t)\times Cs2(t)\times Cs90(t)]=0$ $F1[1]=\beta_1$ Here, $\beta_1$ is a real or complex value. As mentioned before, a sampling circuit (English Sample&Hold) preferably samples the output of the exemplary first low-pass filter LP1 at exactly those times when these conditions are satisfied. In doing so, the technical teachings of this paper disregard the unavoidable slight deviations due to noise and manufacturing errors, etc. Also, the design of the sensor system selects the second filter function F2[ ] such that substantially the following conditions are satisfied:

$F2[Cs(t)]=0$ $F2[Cs2(t)]=0$ $F2[Cs90(t)]=0$ $F2[Cs(t)\times Cs2(t)]=0$ $F2[Cs(t)\times Cs90(t)]=0$ $F2[Cs2(t)\times Cs90(t)]=0$ $F2[Cs(t)\times Cs2(t)\times Cs90(t)]=0$ $F2[1]=\beta_2$.

Here, $\beta_2$ is a real or complex value. As mentioned before, a sampling circuit (English Sample&Hold) preferably samples the output of the exemplary second low-pass filter LP2 exactly those times when these conditions are satisfied. The technical teachings of this paper thereby disregard the unavoidable slight deviations due to noise and manufacturing errors, etc. in the same way, the design of the sensor system selects the third filter function F3[ ] such that essentially the following conditions are satisfied:

$$F3[Cs(t)]=0$$

$$F3[Cs2(t)]=0$$

$$F3[Cs90(t)]=0$$

$$F3[Cs(t) \times Cs2(t)]=0$$

$$F3[Cs(t) \times Cs90(t)]=0$$

$$F3[Cs2(t) \times Cs90(t)]=0$$

$$F3[Cs(t) \times Cs2(t) \times Cs90(t)]=0$$

$$F3[1]=\beta_3$$

Here, $\beta_3$ is a real or complex value. As mentioned before, a sampling circuit (English Sample&Hold) preferably samples the output of the exemplary third low-pass filter LP3 at exactly those times when these conditions are satisfied. The technical teachings of this paper disregard the unavoidable slight deviations due to noise and manufacturing errors etc. Now, in order to detect a defect of the reference element or the sensor element, a second comparison of the value of the third output signal out3 or the value of a signal derived therefrom with a third expected value interval preferably follows. Furthermore, inference of an error preferably follows if the value of the third output signal out3 or the value of the signal derived therefrom is outside the third expected value interval. For example, a third comparator may compare the value of the third output signal out3 with a third threshold value, For example, a fourth comparator may compare the value of the third output signal out3 with a fourth threshold value. For example, the third comparator and a fourth comparator or a signal processor or the like may perform the second comparison.

In order to be able to carry out such procedures, special pressure sensors or sensors are advantageous.

Thus, a pressure sensor is proposed for use in a method according to one or more of the previously described methods. The proposed pressure sensor comprises a Wheatstone bridge with four piezoresistive resistors R1, R2, R3, R4 and a reference Wheatstone bridge with four piezoresistive reference resistors R5, R6, R7, R8. Preferably, the reference resistors R5, R6, R7, R8 of the reference Wheatstone bridge RW are arranged in the same way as the resistors R1, R2, R3, R4 of the Wheatstone bridge WB. To achieve good thermal coupling and thus better noise uniformity, the pressure sensor with the Wheatstone bridge WB as the sensor element and the reference Wheatstone bridge RW as the reference element are arranged together on a monolithic crystal. This means that they are exposed to approximately the same influences during manufacture and operation. The same orientation of the components and the same arrangement of the components relative to each other maximizes this equality.

The pressure sensor comprises at least one first cavity, which is dosed on at least one side by a first membrane and is surrounded by a continuous wall. The cavity surface of the first cavity opposite the first diaphragm may be fully or partially open to allow access of a medium in the case of differential pressure sensors, or closed in the case of absolute pressure sensors. The piezoresistive resistors R1, R2, R3, R4 of the Wheatstone bridge WB are preferably arranged at least partially on the first diaphragm. In this context, the document presented herein refers by way of example to the industrial property rights EP 2 524 389 B1, EP 2 524 390 B1, EP 2 524 198 B1, EP 2 523 896 131 and EP 2 523 895 B1.

There are now several options for the reference sensor element:

A) The reference sensor element may be designed to provide a reference signal Rs which should be equal to the input signal Si. In this case, the reference signal Rs and the input signal Si are equally dependent on the value of the physical quantity that affects the respective output signal of the sensor element and the output signal of the reference element. Thus, a change in the value of this physical quantity then results in a change of equal value in the input signal Si and the reference signal Rs. In the example of a pressure sensor discussed here, this exemplary physical quantity is pressure, B) The reference sensor element may be designed to provide a reference signal Rs. This reference signal Rs should be different from the input signal Si in a predetermined manner, In this case, the input signal Si is provided by the sensor element, In this case, the reference signal Rs and the input signal Si are unequally dependent on the value of the physical quantity which influences the respective output signal of the sensor element and the output signal of the reference element. Thus, a change in the value of this physical quantity results in a non-equal value change in the input signal Si and a non-vanishing change in the reference signal Rs. In the example of a pressure sensor discussed here, this exemplary physical quantity is typically pressure.

C) The reference sensor element may be designed to provide a reference signal Rs which should be different from the input signal Si, namely substantially constant, in a manner known in advance. Thereby, the reference signal Rs is now preferably here substantially not dependent on the value of the physical quantity influencing the respective output signal of the sensor element, In contrast, the input signal Si continues to depend on the value of the physical quantity affecting the respective output signal of the sensor element, so that a change in the value of this physical quantity results in a change in the input signal Si and no or only a negligible change in the reference signal Rs. In the example of a pressure sensor discussed here, this exemplary physical quantity is pressure, Case A) Reference element and sensor element are of the same design.

In the pressure sensor example of case A, the pressure sensor comprises a reference cavity closed on at least one side by a second membrane and surrounded by a continuous wall. Preferably, the second membrane is configured the same as the first membrane. Preferably, the dimensions and shape of the first membrane are equal to the dimensions and shape of the second membrane. Preferably, the reference cavity is configured in the same manner as the first cavity. The cavity surface of the reference cavity opposite the second membrane may be fully or partially open to allow access to a medium, or closed. Preferably, this cavity surface of the reference cavity is closed when the corresponding cavity surface of the first cavity is closed. Preferably, this cavity surface of the reference cavity is open When the corresponding cavity surface of the first cavity is open, in which case the openings of the corresponding cavity surfaces are made in the same way. In the case of closed cavities, the first cavity and the reference cavity are preferably filled with the same gases at the same pressure or with preferably the same vacuum. The piezoresistive reference resistors R5, R6, R7, R8 of the exemplary reference Wheatstone bridge RW are preferably arranged at least partially on the second diaphragm above the reference cavity. In the optimum case, the behavior of the first Wheatstone bridge WB in interaction with the first membrane and the first cavity coincide with the behavior of the reference Wheatstone bridge RW in interaction with the second membrane and the reference cavity, so that essentially no non-zero signal other than noise can be measured at the third output signal out3. If a non-zero signal can be measured at the third output out3 that lies outside the third expected value interval, an error is present, Case B) Reference element and sensor element are designed unequally and the reference element is sensitive to the physical quantity differently than the sensor element.

In this pressure sensor example of case B, the pressure sensor comprises a reference cavity closed on at least one side by a second membrane and surrounded by a continuous wall, in this case, the mechanical structure achieved by the reference cavity and the second membrane preferably differs from the mechanical structure achieved by the first cavity and the first membrane. For example, the second membrane may be designed differently from the first membrane. For example, it may be thicker, thinner, larger, smaller, differently shaped or differently structured. The reference cavity may be shaped differently than the first cavity. For example, the reference cavity may be smaller or larger, deeper or shallower, or differently shaped or differently filled. The cavity surface of the reference cavity facing the second membrane may be shaped differently than the cavity surface of the first cavity facing the first membrane. It may be closed while the other is open, or it may be open while the other is closed. If both are open, the shape, location of the opening within the respective cavity, and size may differ. In the case of closed cavities, they may be filled with dissimilar gases and/or with dissimilar pressure, this writing understanding low pressure to include a vacuum. Of course, it is also conceivable that the piezoresistive resistors R1, R2, R3, R4 of the Wheatstone bridge WB may be of a different design than the reference piezoresistive resistors R5, R6, R7, R8 of the reference Wheatstone bridge RW. This different design may involve the resistor values, size, dimensions, designs, orientations, dopants, etc. In this case, the third output signal out3 and the first output signal out1 together form an output signal vector whose output signal vector value may only be within predetermined ranges. It is therefore possible either to check the two-dimensional output signal vector value of this two-dimensional vector for agreement with a two-dimensional expected value range, or to extract from this two-dimensional output signal vector value the two values of two different physical parameters influencing the sensor element and the reference element differently. If the two-dimensional value of the two-dimensional output vector leaves the two-dimensional expected value range, the sensor system or a higher-level computer system can conclude that an error has occurred.

Case C) Reference element and sensor element are not equal and the reference element is not sensitive to the physical quantity.

In case C, the pressure sensor preferably does not comprise a reference cavity. As a result, the mechanical structure of the reference element in the form of the reference Wheatstone bridge RW deviates massively from the mechanical structure of the sensor element in the form of the Wheatstone bridge WB. Case C is ideally an extreme case of case B. In this extreme case, the reference element then typically no longer has any sensitivity to the physical quantity. In this case, the reference element has the form of the reference Wheatstone bridge RW. The physical quantity here is the physical quantity that the sensor system is to detect by means of the sensor element, in this case in the form of the Wheatstone bridge WB. The reference sensor element RW then typically detects parasitic parameters, such as pressure or humidity. The evaluation is analogous to the evaluation in case B.

Preferably, in this exemplary case of a micromeehanical pressure sensor, the piezoresistive reference resistors R5, R6, R7 RS are arranged such that a deflection of the first diaphragm does not affect the reference resistors R5, R6, R7, R8 of the reference Wheatstone bridge RW. Preferably, the reference resistors R5, R6, R7, R8 are not located on the first diaphragm for this purpose.

The first resistor R1 of the Wheatstone bridge WB resembles a fifth resistor R5 of the reference Wheatstone bridge WB in that it is constructed in the same manner.

The second resistor R2 of the Wheatstone bridge WB resembles a sixth resistor R6 of the reference Wheatstone bridge WB in that it is constructed in the same manner.

The third resistor R3 of the Wheatstone bridge WB resembles a seventh resistor R7 of the reference Wheatstone bridge WB in that it is constructed in the same manner.

The fourth resistor R4 of the Wheatstone bridge WB resembles an eighth resistor R8 of the reference Wheatstone bridge WB in that it is constructed in the same manner.

The sensor system then preferably uses this reference element in this example in the form of a reference Wheatstone bridge RW as a reference noise source for the subsequent signal processing of the input signal Si from the sensor element, in this case the Wheatstone bridge WB.

This paper thus proposes a sensor for use in one of the methods previously presented. In particular, the sensor may be a pressure sensor. The proposed sensor comprises a first resistor R1 having a first terminal and a second terminal. The proposed sensor comprises a second resistor R2 having a first terminal and a second terminal. The proposed sensor has a third resistor R3 having a first terminal and a second terminal. The proposed sensor has a fourth resistor R4 having a first terminal and a second terminal. Now, in order to be able to generate a first differential modulation voltage $V_{mod1}$, the sensor in this example comprises a first voltage source V1 having a first terminal and a second terminal and a second voltage source V2 having a first terminal and a second terminal. The first terminal of the first voltage source V1 is connected to a first supply voltage line VDD. The second terminal of the first voltage source V1 is connected to the first terminal of the first resistor R1. The second terminal of the first resistor R1 is connected to the first terminal of the second resistor R2. The second terminal of the second resistor R2 is connected to a second supply voltage line GND. The first terminal of the second voltage source V2 is connected to the first supply voltage line VDD. The second terminal of the second voltage source V2 is connected to the first terminal of the third resistor R3. The second terminal of the third resistor R3 is connected to the first terminal of the fourth resistor R4. The second terminal of the fourth resistor R4 is connected to the second supply voltage line GND. The first voltage of the first voltage source V1 depends on the test signal TSS. The second voltage of the second voltage source V2 depends on the test signal TSS in the opposite way as the first voltage of the first voltage source V1.

Instead of feeding a test signal via voltage sources V1, V2, V1b, V2b, the signal can also be fed via corresponding current source pairs, in which case the sensor system must excite the Wheatstone bridge WB and the reference Wheatstone bride RW not from voltage source pairs [V1, V2],

[V1b, V2b], but from current source pairs. The Wheatstone bridge WS is thereby assigned a first current source pair. The reference Wheatstone bridge RW is assigned a second current source pair. Each current source pair of these current source pairs then consists of two current sources each. From the current sources of such a current source pair, a first current source of this current source pair feeds a first current into a first branch of the Wheatstone bridge WB or the reference Wheatstone bridge RW, depending on the assignment. Of the current sources of this current source pair, the second current source of this current source pair feeds a second current into the second branch of the Wheatstone bridge WB or the reference Wheatstone bridge RW, depending on the assignment. The first current and the second current depend on the test signal TSS with different signs. In total, the sensor system then requires four current sources, which the design of the sensor system preferably makes equal again (English: matching), For this purpose, this document does not include a drawing, because this possibility is obvious to the person skilled in the art.

Instead of feeding the test signal component into the input signal Si by voltage or current sources, it is also possible to modulate the value of the resistors R1, R2, R3, R4 of the Wheatstone bridge WB and the reference resistors R5, R6, R7, R8 of the reference Wheatstone bridge RW. To this end, the document presented herein proposes here, as a further example, a sensor, in particular a pressure sensor, typically intended for use in a method according to one or more of the previously presented methods. The sensor then comprises a first resistor R1 having a first terminal and a second terminal, and a second resistor R2 having a first terminal and a second terminal, and a third resistor R3 having a first terminal and a second terminal, and a fourth resistor R4 having a first terminal and a second terminal. Further, the sensor comprises a first variable resistor RV1 having a first terminal and a second terminal and a second variable resistor RV2 having a first terminal and a second terminal.

The first terminal of the first variable resistor RV1 is connected to the first supply voltage line VDD. The second terminal of the first variable resistor RV1 is connected to the first terminal of the first resistor R1. The second terminal of the first resistor R1 is connected to the first terminal of the second resistor R2. The second terminal of the second resistor R2 is connected to a second supply voltage line GND. The first terminal of the second variable resistor RV2 is connected to the first supply voltage line VDD. The second terminal of the second variable resistor RV2 is connected to the first terminal of the third resistor R3. The second terminal of the third resistor R3 is connected to the first terminal of the fourth resistor R4. The second terminal of the fourth resistor R4 is connected to the second supply voltage line GND. The resistance value of the first variable resistor RV1 depends on a test signal TSS, and the resistance value of the second variable resistor RV2 depends on the test signal TSS in the opposite way to the resistance value of the first variable resistor RV1. Preferably, the design of the sensor system implements the first variable resistor RV1 and the second variable resistor RV2 identically (English: matching).

Such methods and the exemplary devices of the following figures, at least in some implementations, enable verification of the signal path during operation. However, the advantages are not limited to this.

BRIEF DESCRIPTION OF THE DRAWINGS

The figures represent exemplary designs of the proposals of this paper. They are schematic and simplified.

DESCRIPTION

FIG. 1

Figure 1:
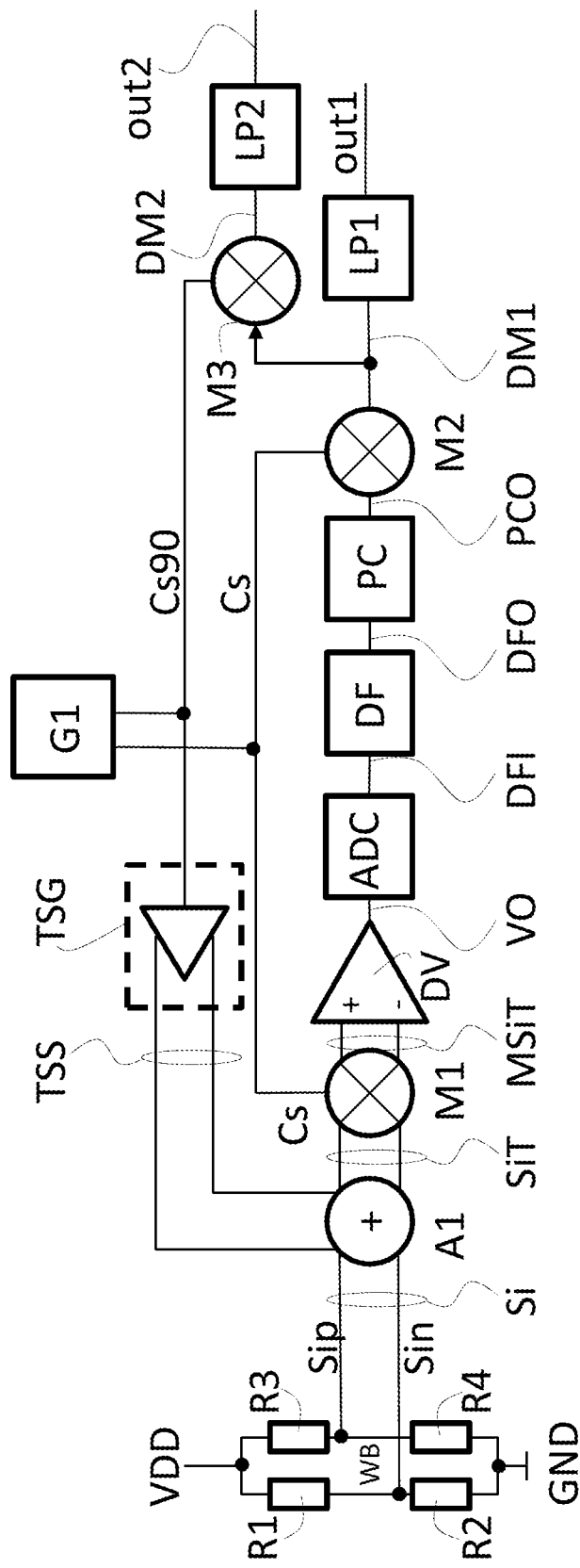
FIG. 1 shows a simple, exemplary example of the disclosure.

FIG. 1 shows a simple, exemplary example of the disclosure. A Wheatstone bridge WB is selected as an exemplary sensor having a differential output. The exemplary Wheatstone bridge WB comprises a first resistor R1, a second resistor R2, a third resistor R3 and a fourth resistor R4. For example, when used in a piezoresistive pressure sensor, the first resistor R1 is a piezoresistive first resistor R1 and the second resistor R2 is a piezoresistive second resistor R2 and the third resistor R3 is a piezoresistive third resistor R3 and the fourth resistor R4 is a piezoresistive fourth resistor R4. The first resistor R1 is connected in series with the second resistor R2 between the first supply voltage line VDD and the second supply voltage line GND. The third resistor R3 is also connected in series with the fourth resistor R4 between the first supply voltage line VDD and the second supply voltage line GND. As an example, the sensor system operates the Wheatstone bridge WB with the supply voltage between the first supply voltage line VDD and the second supply voltage line GND. Accordingly, the Wheatstone bridge WB has a first terminal connected to the supply voltage line VDD and a second terminal connected to the second supply voltage line GND. The node between the first resistor R1 and the second resistor R2 forms a negative input signal Sin of the differential input signal Si, as an example. The node between the third resistor R3 and the fourth resistor R4 forms a positive input signal Sip of the differential input signal Si, by way of example.

The use of Wheatstone bridges is known from many sensor systems for converting the physical parameter in question into a differential voltage signal between a positive input signal Sip and a negative input signal Sin, For example, the Wheatstone bridge WB may be such a bridge of piezoresistive resistors R1, R2, R3, R4 of the sensor elements of a piezoresistive micromechanical pressure sensor or the like.

The signal pair of positive input signal Sip and negative input signal Sin forms the differential input signal Si. In the example of Figure a first adder Al adds a differential test signal TSS to the differential input signal Si to form the differential input signal with test signal component SiT.

The first multiplier M1 multiplies the differential input signal with test signal component SiT by a chopper signal Cs and thus forms the differential, multiplied input signal with test signal component MSiT. Preferably, the chopper signal Cs is a digital signal with two logical values, here exemplarily assigned with 0 and 1. For example, a switching device can firm the first multiplier M1. The design then forms the function of the switching device as follows, for example:

A) With a logical 0 as the value of the chopper signal Cs, the differential multiplied input signal with test signal component MSiT corresponds to the differential input signal with test signal component SiT, B) With a logical 1 as the value of the chopper signal Cs, the differential multiplied input signal with test signal component MSiT corresponds to the differential input signal with test signal component SiT with swapped lines.

A differential amplifier DV amplifies the differential, multiplied input signal with test signal component MSiT to an amplifier output signal VO.

An analog-to-digital converter ADC converts the amplifier output signal VO into an input signal DFI of a digital filter DF. This input signal DFI of the digital filter DF is typically a digital signal of samples of the amplifier output signal VO from the analog-to-digital, converter ADC.

The digital filter DF filters the input signal DFI of the digital filter DF to an output signal DFO of the digital filter DF. In doing so, the digital filter DF suppresses any signal components that may be at interference frequencies. Typically, this is a decimation filter for the conversion artifacts added by the sampling by means of the analog-to-digital converter ADC.

An exemplary phase compensator PC corrects the resulting phase errors and forms a phase compensator output signal PCO.

After amplification and digitization, a second multiplier M2 multi plies the phase compensator output signal PCO with the chopper signal CS to form a first demodulated signal DM1.

A first low-pass filter LP1 suppresses in the first demodulated signal DM1 the frequencies corresponding to the frequencies in the signal spectrum of the chopper signal Cs. The first low-pass filter LP1 also suppresses the frequencies corresponding to the frequencies in the signal spectrum of an orthogonal chopper signal Cs90. Furthermore, the first low-pass filter LP1 suppresses the mixed frequencies that may result from a multiplication of the chopper signal Cs by the orthogonal chopper signal Cs90. The first low-pass filter LP1 suppresses these signal components except for a DC component in the first demodulated signal DM1. The first low-pass filter LP1 thus forms a first output signal out1 whose value corresponds to the value of the differential input signal Si.

A third multiplier M3 mixes the first demodulated signal DM1 with the orthogonal chopper signal Cs90 to form a second demodulated signal DM2. A second low-pass filter LP2 suppresses in the second demodulated signal DM2 the frequencies corresponding to the frequencies in the signal spectrum of the chopper signal Cs. The second low-pass filter LP2 further suppresses the frequencies corresponding to the frequencies in the signal spectrum of the orthogonal chopper signal Cs90. The second low-pass filter LP2 also suppresses the mixed frequencies that may be produced by multiplying the chopper signal Cs by the orthogonal chopper signal Cs90. The second low-pass filter LP2 suppresses these frequencies except for a DC component in the second demodulated signal DM2. The second low-pass filter LP2 thus forms a second output signal out2.

In the example of FIG. 1, a signal generator G1 generates the chopper signal Cs and the orthogonal chopper signal Cs90. Preferably, the chopper signal Cs is bandwidth-limited or monofrequency. Preferably, the orthogonal chopper Cs90 is also bandwidth-limited or monofrequency. Preferably, the orthogonal chopper signal Cs90 is different from the chopper signal Cs. The first low-pass filter LP1 has a first filter property in the form of a first filter function F1[ ] such that: out1=F1[DM1]. The second low-pass filter LP2 has a filter property in the form of a second filter function F2[ ] such that: out2=F2[DM2], Typically, the first low-pass filter LP1 and the second low-pass filter LP2 have a very preferably equal filter property in the form of an equal filter function F[ ]=F1[ ]=F2[ ].

The chopper signal CS and the orthogonal chopper signal Cs90 shall be orthogonal to each other with respect to the first filter LP1 and with respect to the second filter LP2. That is, The following should hold at least at preferred times:

a) $F1[Cs(t) \times Cs90(t)]=0$ b) $F2[Cs(t) \times Cs90(t)]=0$

Here Cs(t) shall represent the time course of the values of the chopper signal Cs and Cs90($t$) shall represent the time course of the values of the orthogonal chopper signal Cs90.

Furthermore, the first filter function F1[ ] shall preferably be an essentially linear filter function. That is, the following should hold for a. signal sum of any first example signal X1($t$) and any second example signal X2($t$) and fur a real number α:

A) $F1[X1(t)+X2(t)]=B1[X1(t)]+F1[X2(t)]$

B) $F1[\alpha \times X1(t)]=\alpha \times F1[X1]$

Furthermore, the second filter function F2[ ] shall preferably be an essentially linear filter function. The following should hold for a signal sum of any first example signal X1($t$) and any second example signal X2($t$) and for a real number α:

C) $F2[X1(t)+X2(t)]=B2[X1(t)]+F2[X2(t)]$

D) $F2[\alpha \times X1(t)]=\alpha \times F2[X1]$

Finally, the first filter function F1[ ] and the second filter function F2[ ] shall each have a low-pass property. That is, the following should hold:

$F1[1]=\beta_1$ and $F2[1]=\beta_2$ with $\beta_1$ as a real non-zero constant and $\beta_2$ as a real non-zero constant.

For example, the chopper signal Cs can be a monofrequency PWM signal with the values −1 and 1 and a duty cycle of 50% and a chopper signal frequency. The orthogonal chopper signal Cs90 can then be, for example, a +/−90° phase-shifted signal with the values −1 and 1 and a duty cycle of 50%. Alternatively, it can be a mono-frequency PWM signal with the values −1 and 1 and a duty cycle of 50% and a signal frequency that is, for example, an integer multiple of the chopper signal frequency. The chopper signal Cs can also be a band-hunted, non-mono-frequency signal. The only important thing is that the orthogonality conditions are satisfied. Typically, the chopper signal Cs is periodic and the orthogonal chopper signal Cs90 is periodic. If necessary, it is useful to provide the first low-pass filter LP1 and the second low-pass filter LP2 each with a holding circuit (English: sample & hold) at their respective outputs. In this case, it is useful to sample the output of the first low-pass filter LP1 with a first holding circuit of the holding circuits at times when the orthogonality conditions a) and b) are satisfied. The first holding circuit outputs the first value sampled in this way as the value of the first output signal out1 until the next time orthogonality conditions a) and b)

are satisfied. In the said case, it is also useful to sample the output of the second low-pass filter LP2 with a second holding circuit of these holding circuits at times when the orthogonality conditions a) and b) are satisfied. The second holding circuit then outputs the second value sampled in this way as the value of the second output signal out2 until the next time that the orthogonality conditions a) and b) are satisfied.

In the example of FIG. 1, a test signal generator TSG, which can also be part of the signal generator G1, generates the test signal TSS from the orthogonal chopper signal Cs90. The test signal generator TSG typically sets the amplitude according to a preset.

The design may also implement the digital filter DF, the phase compensation PC, the signal generator G1, the test signal generator TSG, the second multiplier M2, the third multiplier M3, the first low-pass filter LP1 and the second low-pass filter LP2, for example, by means of a digital circuit or by means of a signal processor system with appropriate programming, Preferably, a comparison means, for example a first comparator in cooperation with a second comparator or said signal processor, compares the value of the second output signal with an expected value range bounded by a first expected value and a second expected value. If the value of the second output signal is between the first expected value and the second expected value, i.e., within the expected value range, the input stage comprising the first multiplier M1, the differential amplifier DVI, the analog-to-digital converter ADC, the digital filter DF, the phase compensator PC and the second multiplier M2 is presumably operating correctly. Thus, the sensor system can make a statement about the presumably correct function of the input stage in this way.

FIG. 2

Figure 2:
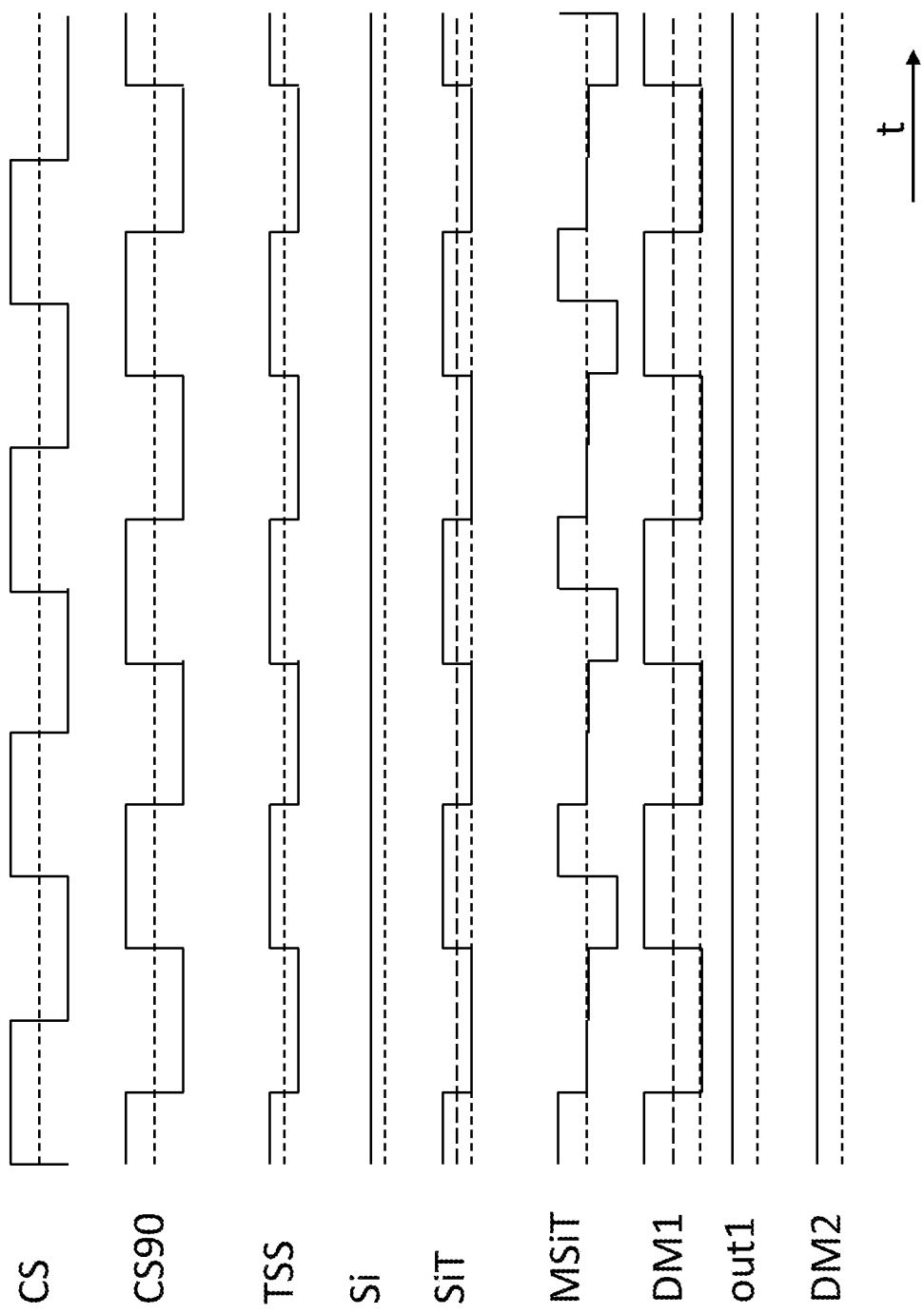
FIG. 2 shows exemplary waveforms for the operation of a device according to FIG. 1.

FIG. 2 shows exemplary waveforms for the operation of a device according to FIG. 1. The levels are chosen arbitrarily. The line dashed with shorter bars is intended to represent the respective zero line. The line dashed with longer dashes shall represent the respective line of the mean value.

FIG. 3

Figure 3:
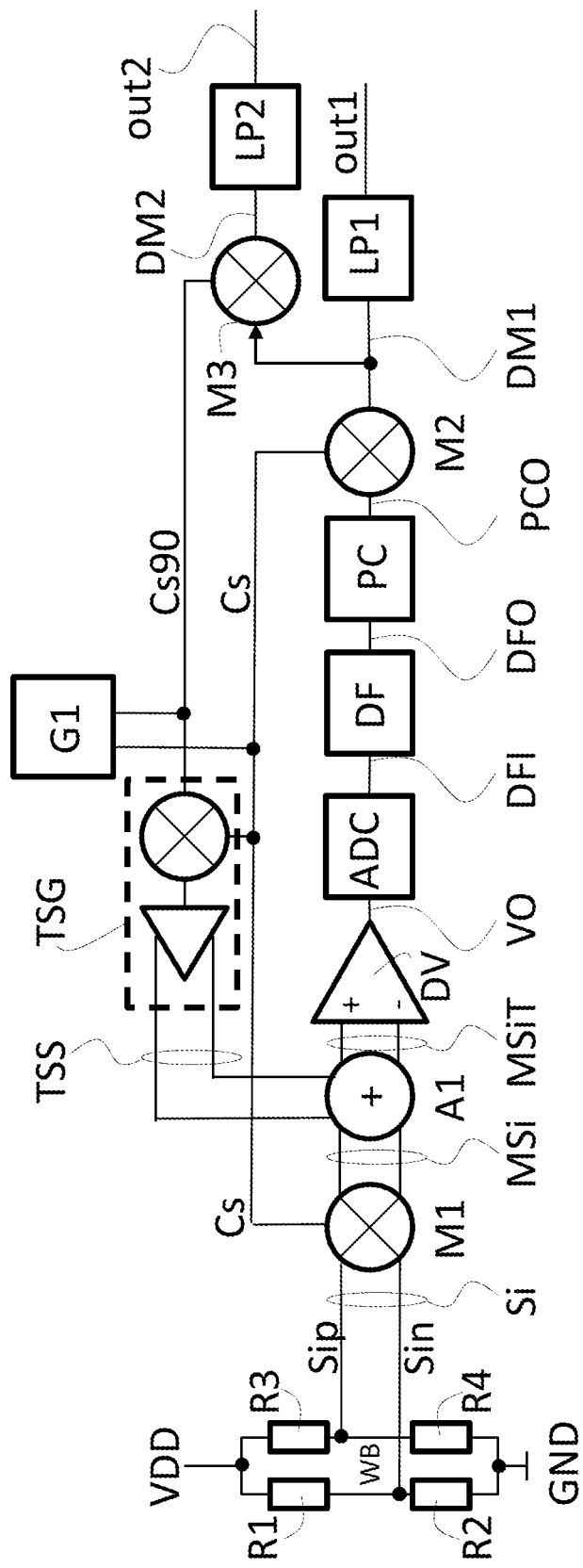
FIG. 3 shows a view corresponding to FIG. 1, wherein the first adder and the first multiplier have swapped order.

FIG. 3 largely corresponds to FIG. 1, but now the first adder A1 and the first multiplier M1 have swapped order in the signal path from the sensor to the first output signal out1. This has the advantage that the design of the sensor system can easily integrate the first adder A1 into the input stage of the differential amplifier DV. However, this has the disadvantage that the test signal TSS now no longer co-tests the first multiplier M1. In addition, a further multiplier is required within the test signal generator TSG, which multiplies the orthogonal chopper signal Cs90 with the chopper signal, (Cs) and processes it to the test signal TSS.

FIG. 4

Figure 4:
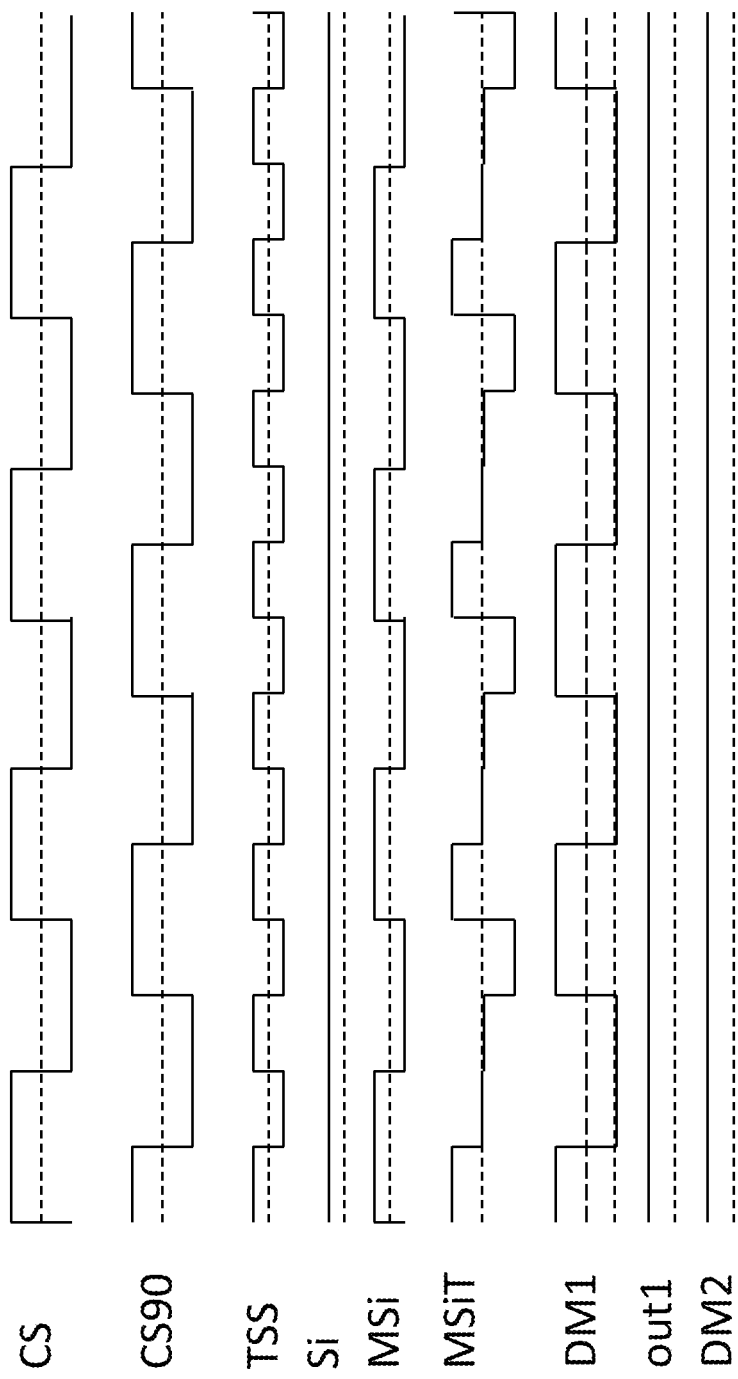
FIG. 4 shows essentially the exemplary signals of FIG. 2 but now adapted to FIG.

FIG. 4 shows essentially the exemplary signals of FIG. 2 but now adapted to FIG. 3.

FIG. 5

Figure 5:
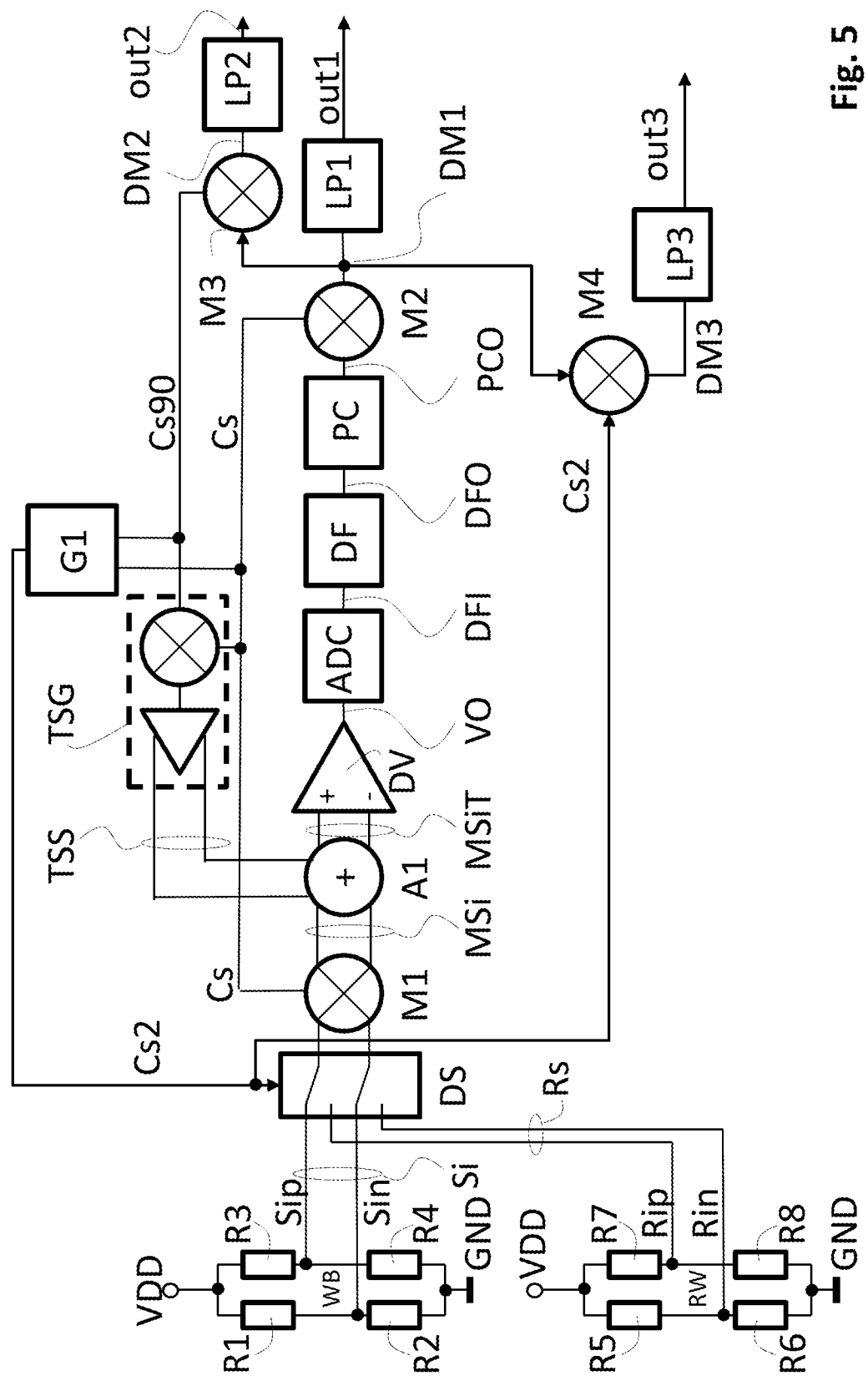
FIG. 5 shows a view based on FIG. 3.

FIG. 5 is based on FIG. 3. In the example of FIG. 5, a reference Wheatstone bridge RW is also provided.

A Wheatstone bridge WB is again selected as an exemplary sensor with a differential output. The Wheatstone bridge WB comprises a first piezoresistive resistor R1, a second piezoresistive resistor R2, a third piezoresistive resistor R3 and a fourth piezoresistive resistor R4. The first resistor R1 is connected in series with the second resistor R2 between the first supply voltage line VDD and the second supply voltage line GND. The third resistor R3 is also connected in series with the fourth resistor R4 between the first supply voltage line VDD and the second supply voltage line GND. The sensor system operates the Wheatstone bridge WB with the supply voltage as an example. Accordingly, the Wheatstone bridge WB has a first terminal connected to the first supply voltage line VDD and a second terminal connected to the second supply voltage line GND. The node between the first resistor R1 and the second resistor R2 forms the negative input signal Sin of the differential input signal Si, as an example. The node between the third resistor R3 and the fourth resistor R4 forms the positive input signal Sip of the differential input signal Si, by way of example.

Many sensor systems use Wheatstone bridges to convert the relevant physical parameter into a differential voltage signal between a positive input signal Sip and a negative input signal Sin. For example, the Wheatstone bridge WB can be such a bridge of piezoresistive resistors of the sensor elements of a piezoresistive micromechanical pressure sensor or the like. At this point, reference is made, for example, to the industrial property rights EP 2 524 389 B1.

EP 2 524 390 B1, EP 2 524 198 B1, EP 2 523 896 B1 and EP 2 523 895 B1 as examples of such pressure sensors.

The reference Wheatstone bridge RW comprises, for example, a fifth piezoresistive resistor R5, a sixth piezoresistive resistor R6, a seventh piezoresistive resistor R7 and an eighth piezoresistive resistor R8. The fifth, resistor R5 is connected in series with the sixth resistor R6 between the first supply voltage line VDD and the second supply voltage line GND. The seventh resistor R7 is also connected in series with the eighth resistor R8 between the first supply voltage line VDD and the second supply voltage line GND. The sensor system operates the reference Wheatstone bridge RW with the supply voltage as an example. Accordingly, the reference Wheatstone bridge RW is connected with a first terminal to the first supply voltage line VDD. The reference Wheatstone bridge RW has a second terminal connected to the second supply voltage line GND. The node between the fifth resistor R5 and the sixth resistor R6 exemplarily forms a negative reference signal Rin of a differential reference signal Rs. The node between the seventh resistor R7 and the eighth resistor 8 exemplarily forms a positive reference signal Rip of the differential reference signal Rs. The fifth resistor R5 and the sixth resistor R6 and the seventh resistor R7 and the eighth resistor R8 represent the resistors of the reference Wheatstone bridge RW. The first resistor R1 and the second resistor R2 and the third resistor R3 and the fourth resistor R4 represent the resistors of the Wheatstone bridge WB. Preferably, the manufacturing process manufactures the resistors of the reference Wheatstone bridge RW using the same steps simultaneously with the resistors of the Wheatstone bridge WB. For example, the Wheatstone bridge WB may be the sensing bridge of a piezoelectric micromechanical pressure sensor, for example on a silicon single crystal piece. In such an example, the manufacturing process according to the design preferably manufactures the reference Wheatstone bridge RW on the same silicon single crystal piece together with the Wheatstone bridge WB. In such an example, the manufacturing process according to the design preferably also manufactures in the same orientation of the corresponding resistors. The technical term for this is "matching". For example, the reference Wheatstone bridge RW may be part of a second pressure sensor similar to the pressure sensor of the Wheatstone bridge WB and fabricated in the same substrate, for example in the same semiconductor crystal. In that case, a third output signal, out3, that represents the value of the difference between the differential value of the reference signal Rs and the differential value of the differential input signal Si should be close to zero.

In the case of a reference Wheatstone bridge WB equal to the Wheatstone bridge, a deviation between the differential value of the reference signal Rs and the differential value of the differential input signal Si represented by the value of the third output signal out3 should then disappear. A value of the third output signal out3 outside a permissible expected value range around this zero value then indicates an error in the case of a reference Wheatstone bridge WB designed equal to the Wheatstone bridge. In this case, by the way, the value of the first output signal indicates only the average between the signal component based on the value of the input signal Si and the signal component based on the value of the reference signal. In this respect the system of FIG. 5 has the disadvantage that the sensitivity is typically halved. Only when the reference Wheatstone bridge RW is subjected to the influence of the influencing physical parameter in the same way as the Wheatstone bridge WB, the reference Wheatstone bridge RW changes its reference signal RS in. dependence on the value of this physical parameter in the same way as the Wheatstone bridge WE changes the input signal Si in dependence on this physical parameter. Only then does the value of the first output signal out1 at maximum sensitivity corresponds to the value of this physical parameter. The physical parameter can be, for example. a pressure in the case of pressure sensors.

However, in the case of a reference Wheatstone bridge RW that is not equal to the Wheatstone bridge WB, a deviation between the differential value of the reference signal Rs and the differential value of the differential input signal Si represented by the value of the third output signal out3 can then no longer disappear. If the reference Wheatstone bridge is substantially insensitive to the physical parameter to be sensed by the Wheatstone bridge WB, the value of the third output signal out3 typically reflects a value for that physical parameter that is typically substantially adjusted for such influencing, factors that affect the reference Wheatstone bridge RW and the Wheatstone bridge in the same manner.

However, it is also conceivable that in the example of a micromechanical pressure sensor, the reference Wheatstone bridge RW is not located on a membrane. In such a case, the reference Wheatstone bridge RW should thus show essentially no pressure-dependent signal. The measured value then appears in the example of FIG. 5 as the value of the third output signal out3.

The advantage of the arrangement of FIG. 5 is that with a good thermal coupling of the reference Wheatstone bridge RW with the Wheatstone bridge WB, the reference Wheatstone bridge RW noises in the same way as the Wheatstone bridge WB itself. This allows the sensor system to also reliably suppress the 1/f noise of the Wheatstone bridge WB itself, which is not possible in FIG. 1.

The signal pair of positive input signal Sip and negative input signal Sin forms the differential input signal Si. The signal pair of positive reference signal Rip and negative reference signal Rin forms the differential reference signal Rs.

A Dicke switch DS switches between the differential input signal Si and the differential reference signal Rs dependent the second chopper signal Cs2.

In the example of FIG. 5, a first multiplier M1 multiplies the resulting mixed signal of differential input signal Si and differential reference signal Rs by the chopper signal Cs to form the multiplied input signal MSi.

The first adder A1 adds the differential test signal TSS to the multiplied input signal MSi and forms the differential, multiplied input signal with test signal component MSiT as shown in FIG. 5. Preferably, the chopper signal Cs is, as before, a digital signal with two logical values, here exemplarily assigned to 0 and 1.

The differential amplifier DV amplifies the differential, multiplied input signal with test signal component MSiT to the amplifier output signal VO.

The analog-to-digital converter ADC converts the amplifier output signal VO into the input signal DFI of the digital filter DF. This input signal DFI of the digital filter DF is typically a digital signal of samples of the amplifier output signal VO from the analog-to-digital convener ADC.

The digital filter OF filters the input signal DFI of the digital filter DF to the output signal DFO of the digital filter DF. In the process, the digital filter DF suppresses any signal components that may be present at interference frequencies. Typically, this is a decimation filter for the conversion artifacts added by the sampling by means of the analog-to-digital converter ADC.

The phase compensator PC corrects the resulting phase errors and forms the phase compensator output signal PCO.

After amplification and digitization, a second multiplier M2 multiplies the phase compensator output signal PCO with the chopper signal Cs to form the first demodulated signal DM1.

A first low-pass filter LP1 suppresses in the first demodulated signal DM1 the frequencies corresponding to the frequencies in the signal spectrum of the chopper signal Cs. The first low-pass filter LP1 suppresses the frequencies corresponding to the frequencies in the signal spectrum of the orthogonal chopper signal Cs90. The first low-pass filter LP1 suppresses the frequencies corresponding to the frequencies in the signal spectrum of the second chopper signal Cs2. The first low-pass filter LP1 suppresses the mixed frequencies that may result from a multiplication of the chopper signal Cs by the orthogonal chopper signal Cs90 and the second chopper signal Cs2. The first low-pass filter LP1 suppresses these frequencies except for a DC component in the first demodulated signal DM1. The first low-pass filter LP1 thus forms the first output signal out1. The value of the first output signal out corresponds to the value of the differential input signal Si if the sensor of the reference Wheatstone bridge RW is equal to the sensor of the Wheatstone bridge WB.

A third multiplier M3 mixes the first demodulated signal DM1 with the orthogonal chopper signal Cs90 to form the second demodulated signal DM2. A second low-pass filter LP2 suppresses in the second demodulated signal DM2 the frequencies corresponding to the frequencies in the signal spectrum of the chopper signal Cs. The second low-pass filter LP2 suppresses the frequencies corresponding to the frequencies in the signal spectrum of the orthogonal chopper signal Cs90. The second low-pass filter LP2 suppresses the frequencies corresponding to the frequencies in the signal spectrum of the second chopper signal Cs2. The second low-pass filter LP2 suppresses the mixed frequencies that may be produced by multiplying the chopper signal Cs by the orthogonal chopper signal Cs90 and the second chopper signal Cs2. The second low-pass filter LP2 suppresses these frequencies except for a DC component in the second demodulated signal DM2. The second low pass filter LP2 thus forms the second output signal out2. As before, the value of this second output signal out2 is a measure for the correct function of the input stage.

A fourth multiplier M4 mixes the first demodulated signal DM1 with the second chopper signal Cs2 to form the third demodulated signal DM3. A third low-pass filter LP3 suppresses the frequencies in the third demodulated signal DM3 which correspond to the frequencies in the signal spectrum of the chopper signal Cs. The third low-pass filter LP3 suppresses the frequencies corresponding to the frequencies in the signal spectrum of the orthogonal chopper signal Cs90. The third low-pass filter LP3 suppresses the frequencies corresponding to the frequencies in the signal spectrum of the second chopper signal Cs2. The third low-pass filter LP3 suppresses the mixed frequencies that may result from a multiplication of the chopper signal Cs by the orthogonal chopper signal Cs90 and the second chopper signal Cs2. The third low-pass filter LP3 suppresses these frequencies except for a DC component in the third demodulated signal DM3. The third low-pass filter thus forms the third output signal out3. A user or a higher-level computer system or another higher-level system can use the value of this third output signal out3 as a measure of the correct operation of the Wheatstone bridge WB if the sensor of the reference Wheatstone bridge RW is equal to the sensor of the Wheatstone bridge WB.

In the example of FIG. 5, a signal generator G1 generates the chopper signal Cs and the orthogonal chopper signal Cs90 and the second chopper signal Cs2. Preferably, the chopper signal Cs is bandwidth-limited or monofrequency. Preferably, the second chopper signal Cs2 is bandwidth-limited or monofrequency. Preferably, the orthogonal chopper signal Cs90 is bandwidth limited or monofrequency. Preferably, the orthogonal chopper signal Cs90 is different from the chopper signal Cs. Preferably, the second chopper signal Cs2 is different from the orthogonal chopper signal Cs90 and from the chopper signal Cs. The first low-pass filter LP1 has a filter property in the form of a first filter function F1[ ] such that: out1=F1[DM1($t$)]. The second low-pass filter LP2 has a filter property in the form of a second filter function F1[ ], so that: out2=F2[DM2($t$)]. The third low-pass filter LP3 has a filter property in the form of a third filter function F3[ ], such that: out3=F3[DM3($t$)]. Typically, the first low-pass filter LP1 and the second low-pass filter LP2 and the third low-pass filter LP3 have a preferably equal filter property in the form of an equal filter function F[ ]=F1[ ]=F2[ ]=F3[ ].

The chopper signal Cs and the second chopper signal Cs2 and the orthogonal chopper signal Cs90 shall each be orthogonal to each other with respect to the first filter LP1 and with respect to the second filter LP2 and with respect to the third filter LP3. That is, the following shall hold:

i) $F1[Cs)t)]=0$ ii) $F1[Cs90(t)]=0$ iii) $F1[Cs2(t)]=0$ iv) $F1[Cs(t)\times Cs90(t)]=0$ v) $F1[Cs(t)\times Cs2(t)]=0$ vi) $F1[Cs90(t)\times Cs2(t)]=0$ vii) $F2[Cs)t)]=0$ viii) $F2[Cs90(t)]=0$ ix) $F2[Cs2(t)]=0$ x) $F2[Cs(t)\times Cs90(t)]=0$ xi) $F2[Cs(t)\times Cs2(t)]=0$ xii) $F2[Cs90(t)\times Cs2(t)]=0$ vii) $F2[Cs)t)]=0$ viii) $F2[Cs90(t)]=0$ ix) $F2[Cs2(t)]=0$ x) $F2[Cs(t)\times Cs90(t)]=0$ xi) $F2[Cs(t)\times Cs2(t)]=0$ xii) $F2[Cs90(t)\times Cs2(t)]=0$ Here Cs(t) shall represent the time course of the values of the chopper signal Cs and Cs90($t$) shall represent the time course of the values of the orthogonal chopper signal Cs90 and Cs2($t$) shall represent the time course of the values of the second chopper signal Cs2.

Furthermore, the first filter function F1[ ] shall preferably be an essentially linear filter function. That is, the following should hold for a signal sum of a first example signal X1($t$) and a second example signal X2($t$) and for a real number$\alpha$:

A) $F1[X1(t)+X2(t)]=B1[X1(t)]+F1[X2(t)]$

B) $F1[\alpha\times X1(t)]=\alpha\times F1[X1]$

Furthermore, the second filter function F2[ ] shall preferably be an essentially linear filter function. That is, the following shall hold for a signal sum of a first example signal X1($t$) and a second example signal X2($t$) and for a real number$\alpha$:

C) $F2[X1(t)+X2(t)]=B2[X1(t)]+F2[X2(t)]$

D) $F2[\alpha\times X1(t)]=\alpha\times F2[X1]$

Finally, the third filter function F3[ ] shall. preferably be an essentially function. That is, the following shall hold for a signal SUM of a first example signal X1($t$) and a second example signal X2($t$) and for a real number$\alpha$:

E) $F3[X1(t)+X2(t)]=F3[X1(t)]+F3[X2(t)]$

F) $F3[\alpha\times X1(t)]=\alpha\times F3[X1]$

Finally, the first filter function F1[ ] and the second filter function F2[ ] and the third filter function F3[ ] shall each have a low-pass property. That is, the following shall hold: $F1[1]=\beta_1$ and $F2[1]=\beta_2$ and $F3[1]=\beta_3$ with$\beta_1$ as a real non-zero constant and$\beta_2$ as a real non-zero constant and$\beta_3$ as a real non-zero constant.

For example, the chopper signal Cs can be a monofrequency PWM signal with the values −1 and 1 and a duty cycle of 50% and a chopper signal frequency. The orthogonal chopper signal Cs90 can then be, for example, a +/−90° phase-shifted signal with the values −1 and 1 and a duty cycle of 50% with the chopper signal frequency. Alternatively, it can be a mono-frequency PWM signal with the values −1 and 1 and a duty cycle of 50% and a signal frequency that is, for example, an integer multiple of the chopper signal frequency. The chopper signal Cs can also be a band-limited, non-mono-frequency signal, The orthogonal chopper signal Cs90 may also be a band-limited, non-mono-frequency signal. Similarly, the second chopper signal Cs2 may be a band-limited, non-mono-frequency signal. It is only important that the orthogonality conditions i) to xviii) are satisfied. Apart from this, the choice of signals is free. Typically, the chopper signal Cs is periodic and the second chopper signal Cs2 and the orthogonal chopper signal Cs90 are periodic. If necessary, it is useful to provide the first low-pass filter LP1 and the second low-pass filter LP2 and the third low-pass filter LP3 each with a holding circuit (English: sample & hold). In this case it makes sense at times when the orthogonality conditions i) to xviii) are satisfied to sample the output of the first low pass filter LP1 with a first holding circuit of these holding circuits. The first holding circuit then outputs the first value sampled this way as the value of the first output signal out1 until the next time orthogonality conditions i) to xviii) are satisfied. In addition, at times when orthogonality conditions i) through xviii) are satisfied, it is useful to sample the output of the second low-pass filter LP2 with a second holding circuit of these holding circuits. The second holding circuit then outputs the second value sampled this way as the value of the second output signal out2 until the next time orthogonality conditions i) through xviii) are satisfied. Finally, at times when orthogonality conditions i) through xviii) are satisfied, it is useful to sample the output of the third low-pass filter LP3 with a third holding circuit of these holding circuits. The third holding circuit then outputs the third value sampled in this way as the value of the third output signal out3 until the next time orthogonality conditions i) to xviii) are satisfied.

In the example of FIG. 5, a test signal generator TSG, which can also be part of the signal generator G1, generates the test signal TSS from the orthogonal chopper signal Cs90. The test signal generator TSG sets the amplitude according to a preset.

The design of the sensor system can also realize some circuit parts with the help of a digital circuit or by means of a signal processor system with an appropriate programming. This concerns especially the digital filter DF, the phase compensation PC, the signal generator G1, the test signal generator TSG, the second multiplier M2, the third multiplier M3, the fourth multiplier M4, the first low pass filter LP1 and the second low pass filter LP2 and the third low pass filter LP3.

Preferably, a comparison means, for example a first comparator in cooperation with a second comparator or said signal processor compares the value of the second output signal out2 with an expected value range bounded by a first expected value and a second expected value. If the value of the second output signal is between the first expected value and the second expected value, i.e. within the expected value range, the input stage comprising the first multiplier M1, the differential amplifier DV1, the analog-to-digital converter ADC, the digital filter DF, the phase compensator PC and the second multiplier M2 operates correctly. Thus, the sensor system or a higher-level computer system or other higher-level device can make a statement about the correct function of the input stage in this way.

Preferably, a second comparison means, for example a third comparator in cooperation with a fourth comparator or said signal processor compares the value of the third output signal out3 with a second expected value range bounded by a third expected value and a fourth expected value. If the value of the third output signal out3 is between the third expected value and the fourth expected value, i.e., within the expected value range, the Wheatstone bridge WB operates correctly relative to the reference Wheatstone bridge RW. Thus, the sensor system or a higher-level computer system or other higher-level device can make a statement about the correct function of the Wheatstone bridge WB in this way.

Thus, the six main operating options are as follows:

| Case | Wheatstone bridge design | The physical parameter (e.g., pressure) affects the reference Wheatstone bridge in the same way. | Effect on the first output signal out1 | Effect on the third output signal out3 | Comments |
|---|---|---|---|---|---|
| 1 | RW = BW | yes | Value of out1 returns measured value with full bridge offset. (corresponds to α = 1) | out3 ≈ 0 (corresponds to α = 1) | Higher-level systems can use the value of out3 to detect errors. |
| 2 | RW ≠ BW RW deviating by factor α sensitive for the physical parameter (assumption same bridge offset) | yes | Value of out1 returns measured value with factor $(1 + \alpha)/2$ with full bridge offset. | Value of out3 returns measured value with factor $(1 - \alpha)/2$ without bridge offset. | Less suitable. Higher-level systems can use the value to detect errors. |
| 3 | RW ≠ BW RW not sensitive to the physical parameter (assumption of same bridge offset) | yes | Value of out1 returns measured value with factor ½ and with full bridge offset. (corresponds to α = 0) | Value of out3 returns ½ measured value without bridge offset. | A measurement without bridge offset is possible. |

| Case | Wheatstone bridge design | The physical parameter (e.g., pressure) affects the reference Wheatstone bridge in the same way. | Effect on the first output signal out1 | Effect on the third output signal out3 | Comments |
|---|---|---|---|---|---|
| 4 | RW = BW | no | Value of out1 returns measured value with full bridge offset. (corresponds to α = 1) | Value of out3 returns ½ measured value without bridge offset. | A measurement without bridge offset is possible. |
| 5 | RW ≠ BW RW deviating by factor α sensitive for the physical parameter (assumption of same bridge offset) | no | Value of out1 returns measured value with factor (1 + α)/2 with full bridge offset. | Value of out3 returns ½ measured value without bridge offset. | A measurement without bridge offset is possible |
| 6 | RW ≠ BW RW not sensitive to the physical parameter (assumption of same bridge offset) | no | Value of out1 returns measured value with factor ½ and with full bridge offset. (corresponds to α = 0) | Value of out3 returns ½ measured value without bridge offset. | A measurement without bridge offset is possible. |

FIG. 6

Figure 6:
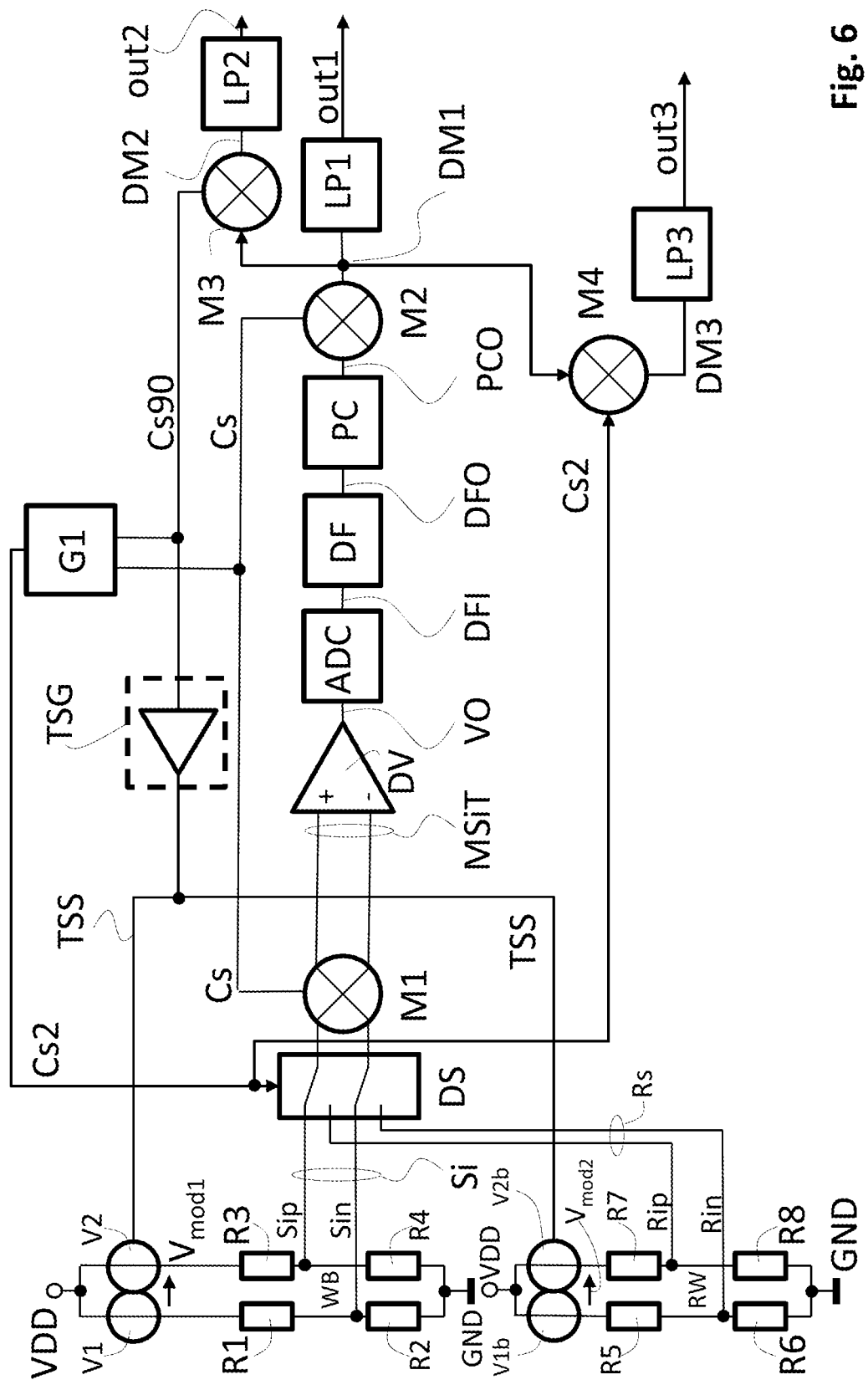
FIG. 6 shows a view largely corresponding to FIG. 5 with the difference that the excitation voltages of the Wheatstone bridge and the reference Wheatstone bridge are modulated in FIG. 6.

FIG. 6 corresponds largely to FIG. 5 with the difference that a first differential modulation voltage $V_{mod1}$ from a first voltage source V1 and a second voltage source V2, which depends on the test signal TSS, modulates the excitation voltage of the Wheatstone bridge WB. The respective voltages of the first voltage source V1 and the second voltage source V2 preferably depend in mutually opposite ways on the test signal TSS. Another difference between FIG. 6 and FIG. 5 is that a second differential modulation voltage $V_{mod2}$ from a third voltage source V1b and a fourth voltage source V2b, which is dependent on the test signal TSS, modulates the excitation voltage of the reference Wheatstone bridge RW. The respective voltages of the third voltage source V1b and the fourth voltage source V2b preferably depend on the test signal TSS in mutually opposite ways.

This modulates both the differential input signal Si and the differential reference signal Rs proportionally with the test signal TSS. The system of FIG. 6 has the advantage that the tested signal path includes the Wheatstone bridge WB and the reference Wheatstone bridge RW. The disadvantage is the effective reduction of the excitation voltage and thus the effective reduction of the useful signal swing of the input signal Si. The first adder is then omitted. Signal processing is performed in an analogous manner as explained for the preceding figures.

The differential voltage source that generates the first differential modulation voltage in the Wheatstone bridge WB consists, for example, of a first voltage source V1 and a second voltage source V2. The first voltage source V1 is connected between the first resistor R1 and the first supply voltage line VDD. The voltage of the first voltage source V1 depends on the test signal TSS. The second voltage source V2 is connected between the third resistor R3 and the first supply voltage line VDD. The voltage of the second voltage source V2 depends on the test signal TSS. The voltage of the first voltage source V1 depends on the test signal TSS in the opposite way as the voltage of the second voltage source V2. Except for this difference in the sign of the dependence on the test signal TSS, the first voltage source V1 and the second voltage source V2 are preferably designed identically. Preferably, they are thermally coupled such that they behave substantially the same, Preferably, therefore, the are fabricated on the same semiconductor substrate.

The differential voltage source that generates the second differential modulation voltage $V_{mod2}$ in the reference Wheatstone bridge RW consists, for example, of a third voltage source V1b and a fourth voltage source V2b. The third voltage source V1b is connected between the fifth resistor R5 and the first supply voltage line VDD. The voltage of the third voltage source V1b depends on the test signal TSS. The fourth voltage source V2b is connected between the seventh resistor R7 and the first supply voltage line VDD. The voltage of the fourth voltage source V2b depends on the test signal TSS. Here, the voltage of the third voltage source V1b depends on the test signal TSS in the opposite way as the voltage of the fourth voltage source V2b. Except for this sign difference of the dependence on the test signal TSS, the third voltage source V1b and the fourth voltage source V2b are preferably designed identically. Preferably, they are thermally coupled such that they behave substantially the same. Preferably, therefore, they are made of the same semiconductor substrate, The voltage of the first voltage source V1 depends on the test signal TSS in the same way as the voltage of the third voltage source V1b. The voltage of the second voltage source V2 depends on the test signal TSS in the same way as the voltage of the fourth voltage source V2b. The first voltage source V1 and the third voltage source V1b are preferably designed in the same way. The second voltage source V2 and the fourth voltage source V2b are preferably implemented in the same way. Preferably, all four are thermally coupled such that they behave substantially the same except for said sign. Preferably, therefore, they are made to match on the same semiconductor substrate.

FIG. 7

Figure 7:
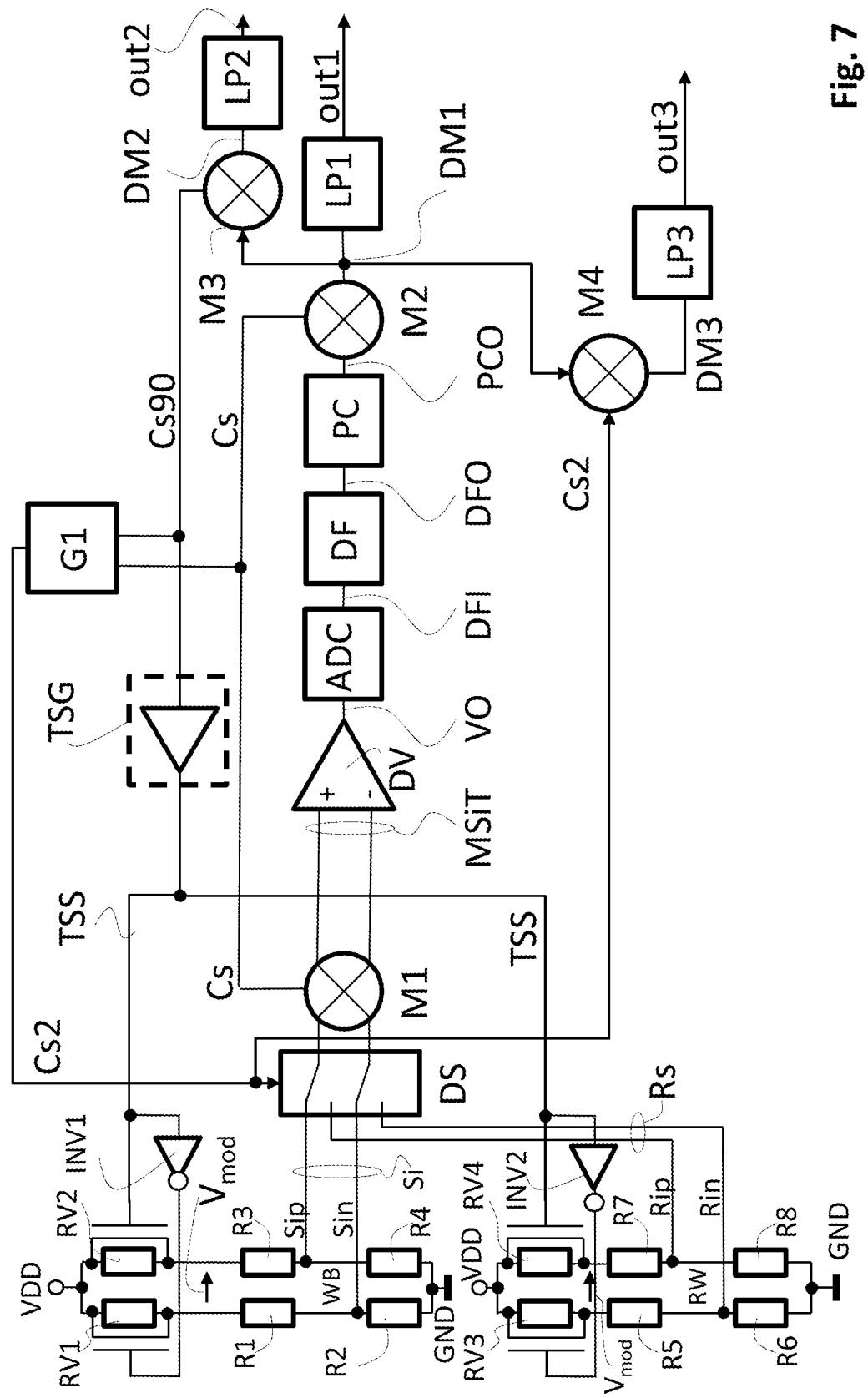
FIG. 7 shows a view largely corresponding to FIG. 6 with the difference that the resistors of the Wheatstone bridge and the reference Wheatstone bridge are modulated in FIG. 7.

FIG. 7 largely corresponds to FIG. 6 with the difference that a first differential modulation voltage $V_{mod1}$ dependent on the test signal TSS does not modulate the excitation voltage of the Wheatstone bridge WB. Here, the first differential modulation voltage $V_{mod1}$ is the differential voltage between the output potential of a first voltage source V1 and the output potential of a second voltage source V2. The respective voltages of the first voltage source V1 and the second voltage source V2 preferably depend on the test signal TSS in mutually opposite ways. In contrast to FIG. 6, the second differential modulation voltage dependent on the test signal TSS does not modulate the excitation voltage of the reference Wheatstone bridge RW. The second differential modulation voltage $V_{mod2}$ is the differential voltage between the output potential of a third voltage source V1b and the output potential of a fourth voltage source V2b. The respective voltages of the third voltage source V1b and the fourth voltage source V2b preferably depend on the test signal TSS in mutually opposite ways.

Instead, the sensor system modulates the value of the first resistor R1 and the value of the third resistor R3 in the Wheatstone bridge WB and the value of the fifth resistor R5 and the value of the seventh resistor R7 in the reference Wheatstone bridge RW.

In FIG. 7, the sensor system modulates the effective value of the first resistor R1. For this purpose, the first terminal of the first resistor R1 is connected to the second terminal of a first variable resistor RV1. Furthermore, for this purpose, the first terminal of the first variable resistor RV1 is connected to the first supply voltage line VDD instead of the first terminal of the first resistor R1. Here, the resistance value of the first variable resistor RV1 depends on the value of the test signal TSS. In the example of FIG. 7, the test signal TSS switches a transistor connected in parallel with the resistance value of the first variable resistor RV1. For the purpose of this writing, this transistor and the resistance value connected in parallel to this transistor together form the first variable resistor RV1. The test signal TSS inverted by means of a first inverting amplifier INV1 controls the transistor of the first variable resistor RV1.

In FIG. 7, the sensor system modulates the effective value of the third resistor R3. For this purpose, the first terminal of the third resistor R3 is connected to the second terminal of a second variable resistor RV2. Furthermore, for this purpose, the first terminal of the second variable resistor RV2 is connected to the first supply voltage line VDD instead of the first terminal of the third resistor R3. The resistance value of the second variable resistor RV2 depends here on the value of the test signal TSS. In the example of FIG. 7, the test signal TSS switches a transistor connected in parallel with the resistance value of the second variable resistor RV2. For the purposes of this writing, this transistor and the resistor value connected in parallel to this transistor together form the second variable resistor RV2. The test signal TSS thereby controls the transistor of the second variable resistor RV2.

In FIG. 7, the sensor system modulates the effective value of the fifth resistor R5. For this purpose, the first terminal of the fifth resistor R5 is connected to the second terminal of a third variable resistor RV3. Furthermore, for this purpose, the first terminal of the third variable resistor RV3 is connected to the first supply voltage line VDD instead of the first terminal of the fifth resistor R5. The resistance value of the third variable resistor RV3 depends here on the value of the test signal TSS. In the example of FIG. 7, the test signal TSS switches a transistor connected in parallel with the resistance value of the third variable resistor RV3. For the purposes of this writing, this transistor and the resistance value connected in parallel to this transistor together form the third variable resistor RV3. The test signal TSS inverted by means of a second inverting amplifier INV2 controls the transistor of the third variable resistor RV3.

In FIG. 7, the sensor system modulates the effective value of the seventh resistor R7. For this purpose, the first terminal of the seventh resistor R7 is connected to the second terminal of a fourth variable resistor RV4. Furthermore, for this purpose, the first terminal of the fourth variable resistor RV4 is connected to the first supply voltage line VDD instead of the first terminal of the seventh resistor R7. The resistance value of the fourth variable resistor RV4 depends here on the value of the test signal TSS. In the example of FIG. 7, the test signal TSS switches a transistor connected in parallel with the resistance value of the fourth variable resistor RV4. For the purposes of this writing, this transistor and the resistor value connected in parallel to this transistor together form the fourth variable resistor RV4. The test signal TSS thereby controls the transistor of the fourth variable resistor RV4.

By this exemplary construction, the test signal TSS modulates both the differential input signal Si and the differential reference signal Rs proportionally. The system of FIG. 7 has the advantage that the tested signal path includes the Wheatstone bridge WB and the reference Wheatstone bridge RW. The disadvantage is the effective reduction of the excitation voltage and thus the effective reduction of the stroke. The first adder is then omitted. Signal processing is performed in an analogous manner as explained for the preceding figures.

Preferably, the resistance values of the first variable resistor RV1 and the third variable resistor RV3 depend on the test signal TSS in the same way.

Preferably, the resistance values of the second variable resistor RV2 and the fourth variable resistor RV4 depend on the test signal TSS in the same way.

Preferably, the resistance values of the first variable resistor RV1 and the second variable resistor RV2 depend on the test signal TSS in an inverse but otherwise identical manner.

Preferably, the resistance values of the third variable resistor RV3 and the fourth variable resistor RV4 depend on the test signal TSS in an inverse but otherwise identical manner.

Preferably, the first variable resistor RV1 is designed to be equal (English: matching) to the second variable resistor RV2.

Preferably, the third variable resistor RV3 is designed to be equal (English: matching) to the fourth variable resistor RV4.

Preferably, the first variable resistor RV1 is designed to be equal (English: matching) to the third variable resistor RV3.

Preferably, the second variable resistor RV2 is designed to be equal (English: matching) to the fourth variable resistor RV4.

LIST OF REFERENCE SYMBOLS

A1 first adder;
ADC analog-to-digital converter;
Cs chopper signal;

Cs2 second chopper signal;
Cs90 orthogonal chopper signal;
DF digital filter;
DFI input signal of the digital filter (DF);
DFO output signal of the digital filter (DF);
DM1 first demodulated signal;
DM2 second demodulated signal;
DM3 third demodulated signal;
DS Dicke switch;
DV differential amplifier;
G1 signal generator;
GND second supply voltage line;
INV1 first inverting amplifier or inverter;
INV2 second inverting amplifier or inverter;
LP1 first low pass filter;
LP2 second inverting amplifier or inverter;
LP3 third low pass filter;
M1 first multiplier;
M2 second multiplier;
M3 third multiplier;
M4 fourth multiplier;
MSi multiplied input signal;
MSiT differential, multiplied input signal with test signal component;
out1 first output signal;
out2 second output signal;
out3 third output signal;
PC phase compensator;
PCO phase compensator output signal;
R1 first resistor;
R2 second resistor;
R3 third resistor;
R4 fourth resistor;
R5 fifth resistor;
R6 sixth resistor;
R7 seventh resistor;
R8 eighth resistor;
Rin negative reference signal;
Rip positive reference
Rs reference signal;
RV1 first variable resistor;
RV2 second variable resistor;
RV3 third variable resistor;
RV4 fourth variable resistor;
RW reference Wheatstone bridge;
Si differential input signal;
Sin negative input signal;
Sip positive input signal;
SiT differential input signal with test signal component;
T time;
TSG test signal generator;
TSS test signal;
WB Wheatstone bridge consisting of first resistor (R1), second resistor (R2), third resistor (R3) and fourth resistor (R4);
V1 first voltage source;
V1b third voltage source;
V2 second voltage source;
V2b fourth voltage source;
$V_{mod1}$ first differential modulation voltage;
$V_{mod2}$ second differential modulation voltage;
VO amplifier output signal;
VDD first supply voltage line;

LIST OF CITED DOCUMENTS

Patent Literature
 EP 2 524 389 B1,
 EP 2 524 390 B1,
 EP 2 524 198 B1,
 EP 2 523 896 B1,
 EP 2 523 895 B1,
Non-Patent Literature
 Script "Introduction to Differential Geometry" by Christopher R. Nerz
Links
 https://de.wikipedia.org/wiki/Lp-Raum #Der_Hilbertraum_L2
 https://www.math.uni-tuebingen.de/de/forschung/gadr/lehre/sose2015/diffgeo.pdf

What is claimed is:

1. A method for monitoring a sensor system in operation:
 wherein the sensor system comprises a sensor element (WB) providing an input signal (Si) with a time course (Si(t)) of an input signal value of the input signal (Si);
 wherein the sensor system comprises a signal path;
 wherein the signal path comprises, at a first location on the signal path, an amplifier (DV) having an input and an output;
 wherein the signal path starts with the input signal (Si) from the sensor element (WB); and
 wherein the signal path ends with a first output signal (out1) of the sensor system and
 wherein a value of the first output signal (out1) or a value of a signal derived therefrom represents a measured value;
 comprising:
 a) first mixing of the input signal (Si) in the signal path with a chopper signal (Cs) at a second location in the signal path;
 wherein the second location is in the signal path between the sensor element (WB) and the input of the amplifier (DV); and
 where the chopper signal (Cs) is band-limited or monofrequency;
 b) second mixing of the input signal (Si) at a third location in the signal path with the chopper signal (Cs) to form a first demodulated signal (DM1);
 wherein a third position in the signal path is between the output of the amplifier (DV) at the first position in the signal path and the first output signal (out1) of the sensor system at the end of the signal path;
 c) first filtering of the first demodulated signal (DM1) or a signal derived therefrom at a fourth position in the signal path between the third position in the signal path on the one hand and the first output signal (out1) of the sensor system at the end of the signal path on the other hand;
 wherein said first filtering is performed by applying a first filter function F1 [ ] to the first demodulated signal (DM1) or the signal derived therefrom;
 wherein the first filter function F1 [ ] describes a relationship between a time course (DM1(t)) of the first demodulated signal (DM1) or of the signal derived therefrom on the one hand and a time course of the signal immediately after the first filtering; and
 wherein the first output signal (out1) depends on or is a result of said first demodulated signal (DM1) immediately after said first filtering;
 characterized by the additional steps and further comprising:

d) adding an orthogonal chopper signal (Cs90) to the input signal (Si) in the signal path at a fifth location in the signal path between the sensor element (WB) and the amplifier (DV);

wherein the chopper signal (Cs) has a time course (Cs (t)) of the chopper signal (Cs);

wherein the orthogonal chopper signal (Cs90) has a time course (Cs90(*t*)) of the orthogonal chopper signal (Cs90); and wherein the time course (Cs90(*t*)) of the orthogonal chopper signal (Cs90) with respect to said first filter function F1 [ ]has a property F1 [Cs90(t)×Cs(t)]=0 at least at times;

e) third mixing of the first demodulated signal (DM1) or a signal derived therefrom with the orthogonal chopper signal (Cs90) or a signal derived therefrom and generating a second demodulated signal (DM2);

f) second filtering of the second demodulated signal (DM2) or a signal derived therefrom by means of a second filter function F2 [ ] to a second output signal (out2); wherein the second filter function F2 [ ] is chosen such that following hold:

$F2[Cs(t)]=0,$ $F2[Cs90(t)]=0,$ $F2[Cs(t)\times Cs90(t)]=0,$ and

F2[1]=$\beta_2$ with $\beta_2$ as real or complex value
and
the first filter function F1 [ ] is chosen such that following hold:

$F1[Cs(t)]=0,$ $F1[Cs90(t)]=0,$ $F1[Cs(t)\times Cs90(t)]=0,$ and

F1[1]=$\beta_1$ with $\beta_1$ as
real or complex value;

g) first comparing of a value of the second output signal (out2) or a value of a signal derived therefrom with an expected value interval and concluding on an error if the value of the second output signal (out2) or the signal derived therefrom is outside the expected value interval.

2. The method according to claim 1 further comprising:
(h) providing a reference element (RW) that provides a reference signal (Rs);
(i) processing the reference signal (Rs) in a reference signal path;
wherein the reference signal path is designed equal to the signal path for processing the input signal (Si);
wherein the reference signal path starts with the reference signal (Rs);
wherein the reference signal path ends with the second output signal (out2);
wherein the reference signal path at a beginning of the reference signal path at the reference signal (Rs) is different from the signal path at a beginning of the signal path at the input signal (Si);
wherein the reference signal path comprises, at a first location of the reference signal path, the amplifier (DV) having the input and the output;

wherein the amplifier (DV) is thus part of the reference signal path at the first location in the reference signal path and part of the signal path at the first location in the signal path;

wherein the reference signal path has a changeover switch (DS) with a first input and a second input at a sixth position in the reference signal path between the reference element (RW) and the input of the amplifier (DV), the sixth position in the reference signal path corresponding to a sixth position in the signal path, so that the changeover switch (DS) is also arranged at a same time at the sixth position in the signal path between the sensor element (WB) and the input of the amplifier (DV), and thus the changeover switch (DS) is a common changeover switch (DS);

wherein the common changeover switch (DS) selects an active input in dependence on second chopper signal (Cs2) between its first input and its second input;

wherein the signal path comprises the first input of the changeover switch (DS);

wherein the reference signal path comprises the second input of the changeover switch (DS);

wherein the signal path does not include the second input of the changeover switch (DS);

wherein the reference signal path does not include the first input of the changeover switch (DS);

wherein the common changeover switch (DS) selects its active input respectively in dependence on the second chopper signal (Cs2) and switches through a respective current value at this respectively selected active input of the common changeover switch (DS) to an output of the common changeover switch (DS);

wherein the reference signal path and the signal path are identical in a section from the output of the common changeover switch (DS) at the sixth position in the reference signal path and at the sixth position in the signal path on the one hand and the input of the amplifier (DV) at the first position in the reference signal path and signal path on the other hand; and wherein the first filtering with the first filter function F1 [ ] is only part of the signal path and not part of the reference signal path;

j) fourth mixing the first demodulated signal (DM1) or a signal derived therefrom with the second chopper signal (Cs2) to form a third demodulated signal (DM3);

k) third filtering of the third demodulated signal (DM3) or a signal derived therefrom by means of a third filter function F3 [ ] to a third output signal (out3);

wherein the first filter function F1 [ ] is chosen such that following hold:

$F1[Cs(t)]=0,$ $F1[Cs2(t)]=0,$ $F1[Cs90(t)]=0,$ $F1[Cs(t)\times Cs2(t)]=0,$ $F1[Cs(t)\times Cs90(t)]=0,$ $F1[Cs2(t)\times Cs90(t)]=0,$ $F1[Cs(t)\times Cs2(t)\times Cs90(t)]=0,$ and $F1[1]=\beta_1\beta_1$ as real or complex value holds;

wherein the second filter function F2 [ ] is selected such that following hold:

$$F2[Cs(t)]=0,$$

$$F2[Cs2(t)]=0,$$

$$F2[Cs90(t)]=0,$$

$$F2[Cs(t) \times Cs2(t)]=0,$$

$$F2[Cs(t) \times Cs90(t)]=0,$$

$$F2[Cs2(t) \times Cs90(t)]=0,$$

$$F2[Cs(t) \times Cs2(t) \times Cs90(t)]=0,$$

and F2 [1]=$\beta_2$ with $\beta_2$ as real or complex value; and wherein the third filter function F3 [ ] is chosen such that following hold:

$$F3[Cs(t)]=0,$$

$$F3[Cs2(t)]=0,$$

$$F3[Cs90(t)]=0,$$

$$F3[Cs(t) \times Cs2(t)]=0,$$

$$F3[Cs(t) \times Cs90(t)]=0,$$

$$F3[Cs2(t) \times Cs90(t)]=0,$$

$$F3[Cs(t) \times Cs2(t) \times Cs90(t)]=0,$$

and F3 [1]=$\beta_3$ with $\beta_3$ as real or complex value; and

1) Second comparing of a value of the third output signal (out3) or a value of a signal derived therefrom with a third expected value interval and concluding an error if the value of the third output signal (out3) or the value of the signal derived therefrom is outside the third expected value interval.

3. A pressure sensor for use in the method according to claim 2:

wherein the pressure sensor comprises a sensor element (WB) in the form of a Wheatstone bridge with four piezoresistive resistors (R1, R2, R3, R4);

wherein the pressure sensor comprises a reference element (RW) in the form of a reference Wheatstone bridge with four piezoresistive reference resistors (R5, R6, R7, R8);

wherein the reference resistors (R5, R6, R7, R8) of the reference Wheatstone bridge (RW) are arranged in a same way as the resistors (R1, R2, R3, R4) of the Wheatstone bridge (WB);

wherein the pressure sensor is disposed on a monolithic crystal;

wherein the pressure sensor comprises a cavity closed on one side by a membrane;

wherein the resistors (R1, R2, R3, R4) of the Wheatstone bridge (WB) are arranged at least partially on the membrane;

wherein the reference resistors (R5, R6, R7, R8) of the reference Wheatstone bridge (RW) are not arranged on the membrane;

wherein a first resistor (R1) of the Wheatstone bridge (WB) is similar to a fifth resistor (R5) of the reference Wheatstone bridge (RW) in that it is constructed in a same manner;

wherein a second resistor (R2) of the Wheatstone bridge (WB) is similar to a sixth resistor (R6) of the reference Wheatstone bridge (RW) in that it is constructed in a same manner;

wherein a third resistor (R3) of the Wheatstone bridge (WB) is similar to a seventh resistor (R7) of the reference Wheatstone bridge (RW) in that it is constructed in a same manner;

wherein a fourth resistor (R4) of the Wheatstone bridge (WB) is similar to an eighth resistor (R8) of the reference Wheatstone bridge (RW) in that it is constructed in a same manner; and wherein the reference Wheatstone bridge (RW) is used as a reference noise source for subsequent signal processing.

4. A pressure sensor for use in the method according to claim 2:

wherein the pressure sensor comprises a sensor element (WB) in the form of a Wheatstone bridge with four piezoresistive resistors (R1, R2, R3, R4);

wherein the pressure sensor comprises a reference element (RW) in the form of a reference Wheatstone bridge with four piezoresistive reference resistors (R5, R6, R7, R8);

wherein the reference resistors (R5, R6, R7, R8) of the reference Wheatstone bridge (RW) are arranged in a same way as the resistors (R1, R2, R3, R4) of the Wheatstone bridge (WB);

wherein the pressure sensor is disposed on a monolithic crystal;

wherein the pressure sensor comprises a first cavity closed on a first side by a first membrane;

wherein the first cavity has a cavity surface of the first cavity opposite the first side of the first cavity;

wherein the pressure sensor comprises a reference cavity closed on a second side by a second membrane;

wherein the reference cavity has a cavity surface of the reference cavity opposite the second side of the reference cavity;

wherein the resistors (R1, R2, R3, R4) of the Wheatstone bridge (WB) are arranged at least partially on the first membrane;

wherein the reference resistors (R5, R6, R7, R8) of the reference Wheatstone bridge (RW) are arranged at least partially on the second membrane;

wherein a first resistor (R1) of the Wheatstone bridge (WB) is similar to a fifth resistor (R5) of the reference Wheatstone bridge (RW) in that it is constructed in a same manner;

wherein a second resistor (R2) of the Wheatstone bridge (WB) is similar to a sixth resistor (R6) of the reference Wheatstone bridge (RW) in that it is constructed in a same manner;

wherein a third resistor (R3) of the Wheatstone bridge (WB) is similar to a seventh resistor (R7) of the reference Wheatstone bridge (RW) in that it is constructed in a same manner;

wherein a fourth resistor (R4) of the Wheatstone bridge (WB) is similar to an eighth resistor (R8) of the reference Wheatstone bridge (RW) in that it is constructed in a same manner;

wherein the reference Wheatstone bridge (RW) is used as a reference noise source for subsequent signal processing; and wherein the first membrane is different in design from the second membrane; and/or wherein the first cavity differs in its design from the reference cavity; and/or wherein the cavity surface of the first cavity opposite the first side of the first cavity is configured differently from the cavity surface of the reference cavity opposite the second side of the reference cavity; and/or wherein the first cavity and the reference cavity are each filled with a fluid, wherein the fluid in the first cavity is different from the fluid in the reference cavity, or the fluid in the first cavity is in a different state than the fluid in the reference cavity, wherein vacuum is considered to be the fluid.

5. A method for monitoring a sensor system in operation:

wherein the sensor system comprises a sensor element (WB) providing an input signal (Si) having an input signal value in dependence on a test signal (TSS);

wherein the sensor system comprises a signal path;

wherein the signal path comprises, at a first location in the signal path, an amplifier (DV) having an input and an output;

wherein the signal path starts with the input signal (Si) from the sensor element (WB);

wherein the signal path ends with a first output signal (out1); and wherein a value of the output signal (out1) represents a measured value;

comprising:

a) first mixing of the input signal (Si) with a chopper signal (Cs) at a second point in the signal path;

wherein the second location is in the signal path between the sensor element (WB) and the input of the amplifier (DV); and wherein the chopper signal (Cs) is band-limited or mono-frequency;

b) second mixing of the input signal at a third location in the signal path with the chopper signal (Cs) to form a first demodulated signal (DM1);

wherein the third location is located in the signal path between the output of the amplifier (DV) on the one hand and the first output signal (out1) of the sensor system on the other hand;

c) first filtering of the first demodulated signal (DM1) or a signal derived therefrom at a fourth position in the signal path between the third position in the signal path on the one hand and the output signal (out1) at the end of the signal path on the other hand;

wherein said first filtering is performed by applying a first filter function F1 [ ] to the first demodulated signal (DM1) or the signal derived therefrom;

wherein the first filter function F1 [ ] describes a relationship between a time course (DM1 (t)) of the first demodulated signal (DM1) or the signal derived therefrom on the one hand and a time course of the input signal (Si) on the other hand, this relationship between the time course (DM1 (t)) of the first demodulated signal (DM1) or of the signal derived therefrom and the time course of the input signal (Si) being a result of filtering the first demodulated signal (DM1) with the first filter function F1 [ ]; and wherein the first output signal (out1) depends on this first demodulated signal (DM1) or is the result of this first filtering;

the method comprising: characterized by the steps, d) generating the test signal (TSS) in dependence on an orthogonal chopper signal (Cs90);

wherein the chopper signal (Cs) has a time course (Cs (t)) of the chopper signal (Cs);

wherein the orthogonal chopper signal (Cs90) has a time course (Cs90 (t)) of the orthogonal chopper signal (Cs90); and wherein the time course (Cs90(t)) of the orthogonal chopper signal (Cs90) with respect to said first filter function F1 [ ] has a property F1 [Cs90(t)×Cs(t)]=0 at least at times;

e) third mixing of the first demodulated signal (DM1) or the signal derived therefrom with the orthogonal chopper signal (Cs90) or a signal derived therefrom and generating a second demodulated signal (DM2);

f) second filtering of the second demodulated signal (DM2) or a signal derived therefrom by means of a second filter function F2 [ ] to a second output signal (out2);

wherein the second filter function F2 [ ] is chosen such that following hold:

$F2[Cs(t)]=0,$ $F2[Cs90(t)]=0,$ $F2[Cs90(t) \times Cs90(t)]=0,$ $F2[Cs(t) \times Cs90(t)]=0,$ $F2[Cs(t) \times Cs(t)=0,$ and F2 [1]=$\beta_2$ with $\beta_2$ as a real or complex value; and wherein the first filter function F1 [ ] is chosen such that following hold:

$F1[Cs(t)]=0,$ $F1[Cs90(t)]=0,$ $F1[Cs(t) \times Cs90(t)]=0,$ and

F1 [1]=$\beta_1$ with $\beta_1$ as a real or complex value; and g) first comparing the value of the second output signal (out2) or the value of a signal derived therefrom with an expected value interval and concluding on an error if the value of the second output signal (out2) or the signal derived therefrom is outside the expected value interval.

6. The method according to claim 5, further comprising:

(h) providing a reference element (RW) that provides a reference signal (Rs);

(i) processing the reference signal (Rs) in a reference signal path;

wherein the reference signal path is designed equal to the signal path for processing the input signal (Si);

wherein the reference signal path starts with the reference signal (Rs);

wherein the reference signal path ends with the second output signal (out2);

wherein the reference signal path at a beginning of the reference signal path at the reference signal (Rs) is different from the signal path at the beginning of the signal path at the input signal (Si);

wherein the reference signal path comprises, at a first location of the reference signal path, the amplifier (DV) having the input and the output;

wherein thus the amplifier (DV) is part of the reference signal path at the first location in the reference signal path and part of the signal path at the first location in the signal path;

wherein at a sixth position in the reference signal path between the reference element (RW) and the input of the amplifier (DV), which corresponds to a sixth position in the signal path between the sensor element (WB) and the input of the amplifier (DV), a changeover switch (DS), which is common to the signal path and the reference signal path and has a first input and a second input, is inserted;

wherein the common changeover switch (DS) selects its first input or its second input as a respective active input in dependence on a second chopper signal (Cs2);

wherein the signal path comprises the first input of the changeover switch (DS);

wherein the reference signal path comprises the second input of the changeover switch (DS);

wherein the signal path does not include the second input of the changeover switch (DS);

wherein the reference signal path does not include the first input of the changeover switch (DS);

wherein the common changeover switch (DS) selects its active input selected in dependence on the second chopper signal (Cs2) and switching through the output of the common changeover switch (DS) a value at this active input of the common changeover switch (DS) corresponding to the input signal (Si) or to the reference signal (Rs);

wherein the reference signal path and the signal path are identical in a section from the output of the common switch (DS) on the one hand and the input of the amplifier (DV) on the other hand; and wherein the first filtering with the first filter function F1 [ ] is not part of the reference signal path;

j) fourth mixing of the first demodulated signal (DM1) or a signal derived therefrom with the second chopper signal (Cs2) to form a third demodulated signal (DM3);

k) third filtering of the third demodulated signal (DM3) or a signal derived therefrom by means of a third filter function F3 [ ] to a third output signal (out3), wherein the first filter function F1 [ ] is chosen such that following hold:

$F1[Cs(t)]=0,$ $F1[Cs2(t)]=0,$ $F1[Cs90(t)]=0,$ $F1[Cs(t) \times Cs2(t)]=0,$ $F1[Cs(t) \times Cs90(t)]=0,$ $F1[Cs2(t) \times Cs90(t)]=0,$ $F1[Cs(t) \times Cs2(t) \times Cs90(t)]=0,$ and $F1[1]=\beta_1\beta_1$ as real or complex value holds; and
wherein the second filter function F2 [ ] is chosen such that following hold:

$F2[Cs(t)]=0,$ $F2[Cs2(t)]=0,$ $F2[Cs90(t)]=0,$ $F2[Cs(t) \times Cs2(t)]=0,$ $F2[Cs(t) \times Cs90(t)]=0,$ $F2[Cs2(t) \times Cs90(t)]=0,$ $F2[Cs(t) \times Cs2(t) \times Cs90(t)]=0,$ $F2[1]=\beta_2$ with $\beta_2$ as real or complex value holds; and
wherein the third filter function F3 [ ] is chosen such that F3 [Cs(t)]=0, $F3[Cs(t)]=0,$ $F3[Cs2(t)]=0,$ $F3[Cs90(t)]=0,$ $F3[Cs(t) \times Cs2(t)]=0,$ $F3[Cs(t) \times Cs90(t)]=0,$ $F3[Cs2(t) \times Cs90(t)]=0,$ $F3[Cs(t) \times Cs2(t) \times Cs90(t)]=0,$ and $F3[1]=\beta_3$ with $\beta_3$ as real or complex value; and 1) Second comparing the value of the third output signal (out3) or the value of a signal derived therefrom with a third expected value interval and concluding an error if the value of the third output signal (out3) or the value of the signal derived therefrom is outside the third expected value interval.

7. A pressure sensor for use in the method according to claim 6:
wherein the pressure sensor comprises a sensor element (WB) in the form of a Wheatstone bridge with four piezoresistive resistors (R1, R2, R3, R4);
wherein the pressure sensor comprises a reference element (RW) in the form of a reference Wheatstone bridge with four piezoresistive reference resistors (R5, R6, R7, R8);
wherein the reference resistors (R5, R6, R7, R8) of the reference Wheatstone bridge (RW) are arranged in a same way as the resistors (R1, R2, R3, R4) of the Wheatstone bridge (WB);
wherein the pressure sensor is disposed on a monolithic crystal;
wherein the pressure sensor comprises a cavity closed on one side by a membrane;
wherein the resistors (R1, R2, R3, R4) of the Wheatstone bridge (WB) are arranged at least partially on the membrane;
wherein the reference resistors (R5, R6, R7, R8) of the reference Wheatstone bridge (RW) are not arranged on the membrane;
wherein a first resistor (R1) of the Wheatstone bridge (WB) is similar to a fifth resistor (R5) of the reference Wheatstone bridge (RW) in that it is constructed in a same manner;
wherein a second resistor (R2) of the Wheatstone bridge (WB) is similar to a sixth resistor (R6) of the reference Wheatstone bridge (RW) in that it is constructed in a same manner;
wherein a third resistor (R3) of the Wheatstone bridge (WB) is similar to a seventh resistor (R7) of the reference Wheatstone bridge (RW) in that it is constructed in a same manner;
wherein a fourth resistor (R4) of the Wheatstone bridge (WB) is similar to an eighth resistor (R8) of the reference Wheatstone bridge (RW) in that it is constructed in a same manner; and
wherein the reference Wheatstone bridge (RW) is used as a reference noise source for subsequent signal processing.

8. A pressure sensor for use in the method according to claim 6:

wherein the pressure sensor comprises a sensor element (WB) in the form of a Wheatstone bridge with four piezoresistive resistors (R1, R2, R3, R4);
wherein the pressure sensor comprises a reference element (RW) in the form of a reference Wheatstone bridge with four piezoresistive reference resistors (R5, R6, R7, R8);
wherein the reference resistors (R5, R6, R7, R8) of the reference Wheatstone bridge (RW) are arranged in a same way as the resistors (R1, R2, R3, R4) of the Wheatstone bridge (WB);
wherein the pressure sensor is disposed on a monolithic crystal;
wherein the pressure sensor comprises a first cavity closed on a first side by a first membrane;
wherein the first cavity has a cavity surface of the first cavity opposite the first side of the first cavity;
wherein the pressure sensor comprises a reference cavity closed on a second side by a second membrane;
wherein the reference cavity has a cavity surface of the reference cavity opposite the second side of the reference cavity;
wherein the resistors (R1, R2, R3, R4) of the Wheatstone bridge (WB) are arranged at least partially on the first membrane;
wherein the reference resistors (R5, R6, R7, R8) of the reference Wheatstone bridge (RW) are arranged at least partially on the second membrane;
wherein a first resistor (R1) of the Wheatstone bridge (WB) is similar to a fifth resistor (R5) of the reference Wheatstone bridge (RW) in that it is constructed in a same manner;
wherein a second resistor (R2) of the Wheatstone bridge (WB) is similar to a sixth resistor (R6) of the reference Wheatstone bridge (RW) in that it is constructed in a same manner;
wherein a third resistor (R3) of the Wheatstone bridge (WB) is similar to a seventh resistor (R7) of the reference Wheatstone bridge (RW) in that it is constructed in a same manner;
wherein a fourth resistor (R4) of the Wheatstone bridge (WB) is similar to an eighth resistor (R8) of the reference Wheatstone bridge (RW) in that it is constructed in a same manner;
wherein the reference Wheatstone bridge (RW) is used as a reference noise source for subsequent signal processing; and
wherein the first membrane is different in design from the second membrane; and/or
wherein the first cavity differs in its design from the reference cavity; and/or
wherein the cavity surface of the first cavity opposite the first side of the first cavity is configured differently from the cavity surface of the reference cavity opposite the second side of the reference cavity; and/or
wherein the first cavity and the reference cavity are each filled with a fluid, wherein the fluid in the first cavity is different from the fluid in the reference cavity, or the fluid in the first cavity is in a different state than the fluid in the reference cavity, wherein vacuum is considered to be the fluid.

9. A sensor for use in the method according to claim 6:
wherein the sensor comprises a first resistor (R1) having a first terminal and a second terminal;
wherein the sensor comprises a second resistor (R2) having a first terminal and a second terminal;
wherein the sensor comprises a third resistor (R3) having a first terminal and a second terminal;
wherein the sensor comprises a fourth resistor (R4) having a first terminal and a second terminal;
wherein the sensor comprises a first voltage source (V1) having a first terminal and a second terminal;
wherein the sensor comprises a second voltage source (V2) having a first terminal and a second terminal;
wherein the first terminal of the first voltage source (V1) is connected to a first supply voltage line (VDD);
wherein the second terminal of the first voltage source (V1) is connected to the first terminal of the first resistor (R1);
wherein the second terminal of the first resistor (R1) is connected to the first terminal of the second resistor (R2);
wherein the second terminal of the second resistor is connected to a second supply voltage line (GND);
wherein the first terminal of the second voltage source (V2) is connected to the first supply voltage line (VDD);
wherein the second terminal of the second voltage source (V2) is connected to the first terminal of the third resistor (R3);
wherein the second terminal of the third resistor (R3) is connected to the first terminal of the fourth resistor (R4);
wherein the second terminal of the fourth resistor (R4) is connected to the second supply voltage line (GND);
wherein a first voltage of the first voltage source (V1) depends on a test signal (TSS); and
wherein a second voltage of the second voltage source (V2) depends on the test signal (TSS) in an inverse manner to the first voltage of the first voltage source (V1).

10. The sensor according to claim 9, wherein the sensor is a pressure sensor.

11. A sensor for use in the method according to claim 6:
wherein the sensor comprises a first resistor (R1) having a first terminal and a second terminal;
wherein the sensor comprises a second resistor (R2) having a first terminal and a second terminal;
wherein the sensor comprises a third resistor (R3) having a first terminal and a second terminal;
wherein the sensor comprises a fourth resistor (R4) having a first terminal and a second terminal;
wherein the sensor comprises a first variable resistor (RV1) having a first terminal and a second terminal;
wherein the sensor comprises a second variable resistor (RV2) having a first terminal and a second terminal;
wherein the first terminal of the first variable resistor (RV1) is connected to a first supply voltage line (VDD);
wherein the second terminal of the first variable resistor (RV1) is connected to the first terminal of the first resistor (R1);
wherein the second terminal of the first resistor (R1) is connected to the first terminal of the second resistor (R2);
wherein the second terminal of the second resistor is connected to a second supply voltage line (GND);
wherein the first terminal of the second variable resistor (RV2) is connected to the first supply voltage line (VDD);
wherein the second terminal of the second variable resistor (RV2) is connected to the first terminal of the third resistor (R3);

wherein the second terminal of the third resistor (R3) is connected to the first terminal of the fourth resistor (R4);
wherein the second terminal of the fourth resistor (R4) is connected to the second supply voltage line (GND);
wherein a resistance value of the first variable resistor (RV1) depends on a test signal (TSS); and
wherein a resistance value of the second variable resistor (RV2) depends on the test signal (TSS) in an inverse manner to the resistance value of the first variable resistor (RV1).

12. The sensor according to claim 11, wherein the sensor is a pressure sensor.

13. A sensor for use in the method according to claim 5:
wherein the sensor comprises a first resistor (R1) having a first terminal and a second terminal;
wherein the sensor comprises a second resistor (R2) having a first terminal and a second terminal;
wherein the sensor comprises a third resistor (R3) having a first terminal and a second terminal;
wherein the sensor comprises a fourth resistor (R4) having a first terminal and a second terminal;
wherein the sensor comprises a first voltage source (V1) having a first terminal and a second terminal;
wherein the sensor comprises a second voltage source (V2) having a first terminal and a second terminal;
wherein the first terminal of the first voltage source (V1) is connected to a first supply voltage line (VDD);
wherein the second terminal of the first voltage source (V1) is connected to the first terminal of the first resistor (R1);
wherein the second terminal of the first resistor (R1) is connected to the first terminal of the second resistor (R2);
wherein the second terminal of the second resistor is connected to a second supply voltage line (GND);
wherein the first terminal of the second voltage source (V2) is connected to the first supply voltage line (VDD);
wherein the second terminal of the second voltage source (V2) is connected to the first terminal of the third resistor (R3);
wherein the second terminal of the third resistor (R3) is connected to the first terminal of the fourth resistor (R4);
wherein the second terminal of the fourth resistor (R4) is connected to the second supply voltage line (GND);
wherein a first voltage of the first voltage source (V1) depends on a test signal (TSS); and
wherein a second voltage of the second voltage source (V2) depends on the test signal (TSS) in an inverse manner to the first voltage of the first voltage source (V1).

14. A sensor for use in the method according to claim 5:
wherein the sensor comprises a first resistor (R1) having a first terminal and a second terminal;
wherein the sensor comprises a second resistor (R2) having a first terminal and a second terminal;
wherein the sensor comprises a third resistor (R3) having a first terminal and a second terminal;
wherein the sensor comprises a fourth resistor (R4) having a first terminal and a second terminal;
wherein the sensor comprises a first variable resistor (RV1) having a first terminal and a second terminal;
wherein the sensor comprises a second variable resistor (RV2) having a first terminal and a second terminal;
wherein the first terminal of the first variable resistor (RV1) is connected to a first supply voltage line (VDD);
wherein the second terminal of the first variable resistor (RV1) is connected to the first terminal of the first resistor (R1);
wherein the second terminal of the first resistor (R1) is connected to the first terminal of the second resistor (R2);
wherein the second terminal of the second resistor is connected to a second supply voltage line (GND);
wherein the first terminal of the second variable resistor (RV2) is connected to the first supply voltage line (VDD);
wherein the second terminal of the second variable resistor (RV2) is connected to the first terminal of the third resistor (R3);
wherein the second terminal of the third resistor (R3) is connected to the first terminal of the fourth resistor (R4);
wherein the second terminal of the fourth resistor (R4) is connected to the second supply voltage line (GND);
wherein a resistance value of the first variable resistor (RV1) depends on a test signal (TSS); and
wherein a resistance value of the second variable resistor (RV2) depends on the test signal (TSS) in an inverse manner to the resistance value of the first variable resistor (RV1).

* * * * *